(12) United States Patent
Kojima et al.

(10) Patent No.: US 9,379,173 B2
(45) Date of Patent: Jun. 28, 2016

(54) LIGHT EMITTING PANEL AND METHOD FOR MANUFACTURING SAME

(71) Applicant: Konica Minolta, Inc., Tokyo (JP)

(72) Inventors: Shigeru Kojima, Tokyo (JP); Kazuo Genda, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 31 days.

(21) Appl. No.: 14/380,861

(22) PCT Filed: Dec. 3, 2012

(86) PCT No.: PCT/JP2012/081238
§ 371 (c)(1),
(2) Date: Aug. 25, 2014

(87) PCT Pub. No.: WO2013/128740
PCT Pub. Date: Sep. 6, 2013

(65) Prior Publication Data
US 2015/0028316 A1    Jan. 29, 2015

(30) Foreign Application Priority Data

Feb. 29, 2012  (JP) ................................. 2012-042704

(51) Int. Cl.
*H01L 27/00*    (2006.01)
*H01L 27/32*    (2006.01)
(Continued)

(52) U.S. Cl.
CPC ........ *H01L 27/3293* (2013.01); *H01L 51/0097* (2013.01); *H01L 51/5203* (2013.01);
(Continued)

(58) Field of Classification Search
CPC .................. H01L 2227/323; H01L 2251/5338; H01L 2251/5361; H01L 27/3293; H01L 51/0097; H01L 51/5203; H01L 51/5212; H01L 51/5253; H01L 51/56

See application file for complete search history.

(56) References Cited

U.S. PATENT DOCUMENTS

| 2005/0082971 A1* | 4/2005 | Couillard ............ H01L 51/5237 313/511 |
| 2006/0091794 A1 | 5/2006 | Agostinelli et al. |
| 2012/0091477 A1* | 4/2012 | Kim .................... H01L 51/5246 257/88 |

FOREIGN PATENT DOCUMENTS

| JP | 2004-068143 A | 3/2004 |
| JP | 2004-251981 A | 9/2004 |

(Continued)

OTHER PUBLICATIONS

International Preliminary Report on Patentability and Written Opinion in corresponding International Application No. PCT/JP2012/081238 mailed Sep. 12, 2014 (9 pages).
International Search Report for corresponding International Application No. PCT/JP2012/081238, mailed Mar. 5, 2013 (1 page).

*Primary Examiner* — Whitney T Moore
*Assistant Examiner* — Joseph Galvin, III
(74) *Attorney, Agent, or Firm* — Osha Liang LLP

(57) ABSTRACT

In a light emitting panel, organic EL panels are laminated in a step-like shape in a front-back direction to form organic EL panel groups, and the organic EL panel groups are further laminated in a step-like shape in a left-right direction. Each of the organic EL panels comprises a power feed part at one side of the transparent support substrate in the left-right direction. The power feed part of each of the organic EL panels is aligned with other power feed parts in the front-back direction at one side of the left-right direction, and is disposed at a position that allows the power feed part to overlap with a laminate of an organic EL panel of an adjacent organic EL panel group.

9 Claims, 21 Drawing Sheets

(51) Int. Cl.
*H01L 51/52* (2006.01)
*H01L 51/00* (2006.01)
*H01L 51/56* (2006.01)

(52) U.S. Cl.
CPC ........ *H01L51/5212* (2013.01); *H01L 51/5253* (2013.01); *H01L 51/56* (2013.01); *H01L 2227/323* (2013.01); *H01L 2251/5338* (2013.01); *H01L 2251/5361* (2013.01)

(56) References Cited

FOREIGN PATENT DOCUMENTS

| | | | |
|---|---|---|---|
| JP | 2004251981 A | * | 9/2004 |
| JP | 2005-17738 A | | 1/2005 |
| JP | 2009-139463 A | | 6/2009 |
| JP | 2009139463 A | * | 6/2009 |
| WO | 2011/059071 A1 | | 5/2011 |

* cited by examiner

BACK ← B → FRONT

LEFT ← A → RIGHT

BACK ↕ B ↕ FRONT

LEFT ←─A─→ RIGHT

LIGHT EMITTING PANEL AND METHOD FOR MANUFACTURING SAME

TECHNICAL FIELD

Embodiments of the invention relate to a light emitting panel and a method for manufacturing the same.

BACKGROUND

Organic electroluminescence (organic EL) elements are characterized by the capability of operating at a low voltage of several volts to tens of volts, wide angle of visibility and high visibility due to the self-luminescent property, and being complete solid-state elements in the form of a thin film. Because of these characteristics, organic EL elements are beginning to become popular in the market. For example, they are used for displays and lighting equipment, and are also used for main displays of mobile phones in terms of space-saving, energy-saving and portability. In recent years, there has been an increasing demand for large-area organic EL panels used for lighting equipment or displays.

However, there are problems with manufacturing large-area organic EL panels, such as the large size of the apparatuses therefor, degraded brightness distribution and low yield.

To cope with these problems, tiling techniques of piecing small-area organic EL panels together have been proposed.

For example, Patent Document 1 discloses a technique of arranging organic EL panels in a step-like shape such that a transparent substrate part of an organic EL panel is laid on a display part of another organic EL panel. This configuration enables provision of a display apparatus that does not have any non-luminescent area. However, Patent Document 1 does not describe any specific manner for arranging organic EL panels such as adhesion and wiring between them. Further, since the light emitting panel has a not rectangular but uneven outer shape, it was found that there are difficulties, for example, in incorporation into lighting equipment.

Patent Document 2 discloses a technique of mounting a plurality of organic EL panels on a holder plate and inserting opposing two sides of organic EL elements in holding grooves of the holder plate to fix them. Each of the organic EL panels has a connector for connecting an electrode to an outer terminal, and is connected to the outer terminal by the connector being inserted in a connection hole of the holder plate. However, considering the possibility of outdoor use as well as indoor use, it was found that this technique cannot achieve sufficient levels of strength, moisture resistance and drip-proof performance.

PRIOR ART DOCUMENT

Patent Document

Patent Document 1: Japanese Patent Unexamined Publication No. 2004-251981

Patent Document 2: Japanese Patent Unexamined Publication No. 2009-139463

SUMMARY OF THE INVENTION

One or more embodiments of the present invention provide a large-area light emitting panel with high strength, high moisture resistance and high drip-proof performance.

According to one or more embodiments of the present invention, a light emitting panel may include a plurality of organic EL panels each of which comprises a laminate formed by laminating a positive electrode, an organic compound layer and a negative electrode on a transparent support substrate and a transparent sealing member to seal the laminate. The plurality of organic EL panels may be laminated in a step-like shape in a front-back direction to form a plurality of organic EL panel groups, and the plurality of organic EL panel groups may be further laminated in a step-like shape in a left-right direction.

Each of the plurality of organic EL panels may include a power feed part which is formed by exposing a part of the positive electrode and a part of the negative electrode of the laminate from the transparent sealing member at one side of the transparent support substrate in the left-right direction.

The power feed part of each of the plurality of organic EL panels may be aligned with other power feed part in the front-back direction at one side of the left-right direction, and is disposed at a position that allows the power feed part to overlap with a laminate of an organic EL panel of an adjacent organic EL panel group.

With one or more embodiments of the invention, it becomes possible to provide a large-area light emitting panel with high strength, high moisture resistance and high drip-proof performance.

DETAILED DESCRIPTION

Hereinafter, embodiments of the present invention will be described with reference to the drawings.

(Configuration of Light Emitting Panel)

Figure 1:
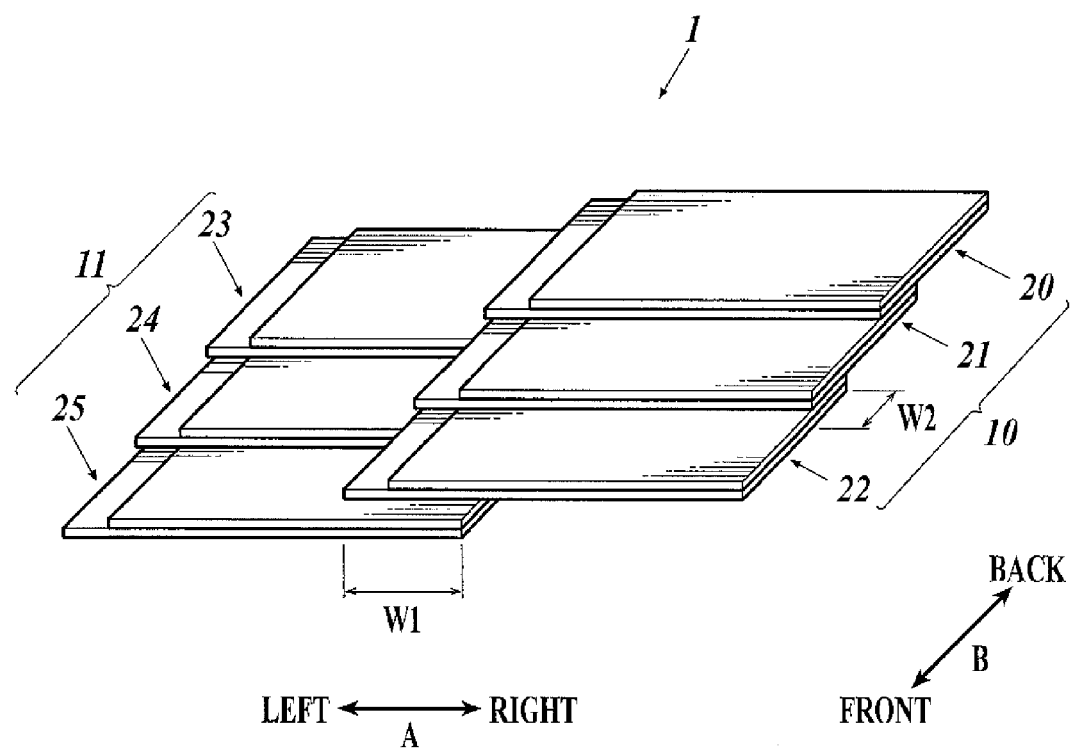
FIG. 1 is a perspective view illustrating the schematic configuration of a light emitting panel in accordance with one or more embodiments of the invention.

As illustrated in FIG. 1, a light emitting panel 1 includes a plurality of organic EL panel groups 10 and 11 in accordance with one or more embodiments of the invention. As an example, FIG. 1 illustrates the light emitting panel 1 that is composed of two organic EL panel groups 10 and 11.

The light emitting panel 1 has a laminated structure in which the left part of the organic EL panel group 10 in the left-right direction A overlaps with the right part of the organic EL panel group 11 in the left-right direction A.

The organic EL panel groups 10 and 11 are joined with each other via adhesive/bond.

The adhesive/bond may be of any type, but silicone adhesive may be used in terms of strength of the light emitting panel 1. Further, the difference in refractive index between the adhesive/bond and the glass may be small. Specifically, the difference in refractive index may be equal to or less than 0.3, equal to or less than 0.1, or equal to or less than 0.05.

(Configuration of Organic EL Panel)

Figure 2A:
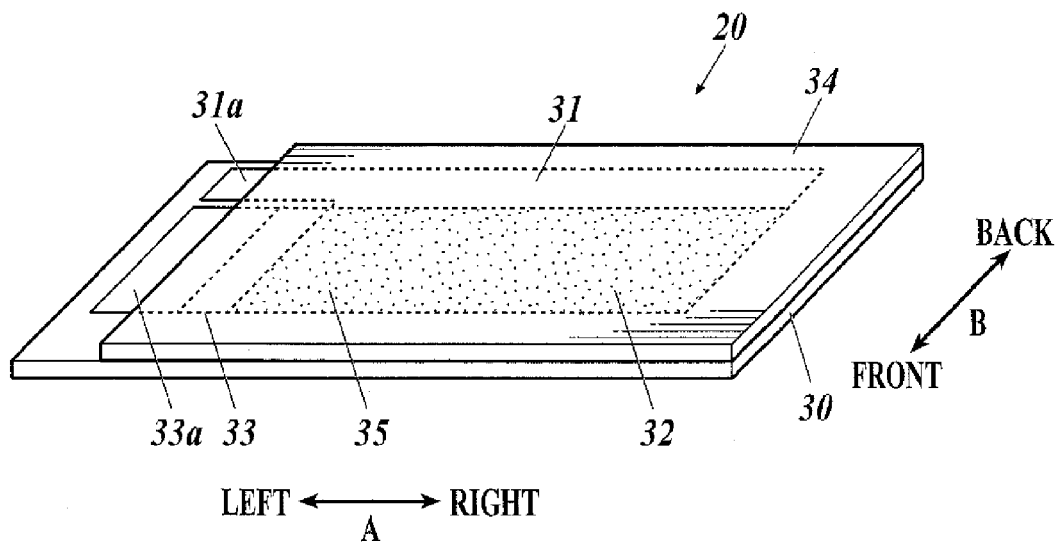
FIG. 2A is a perspective view illustrating the schematic configuration of an organic EL panel in accordance with one or more embodiments of the invention.
Figure 2B:
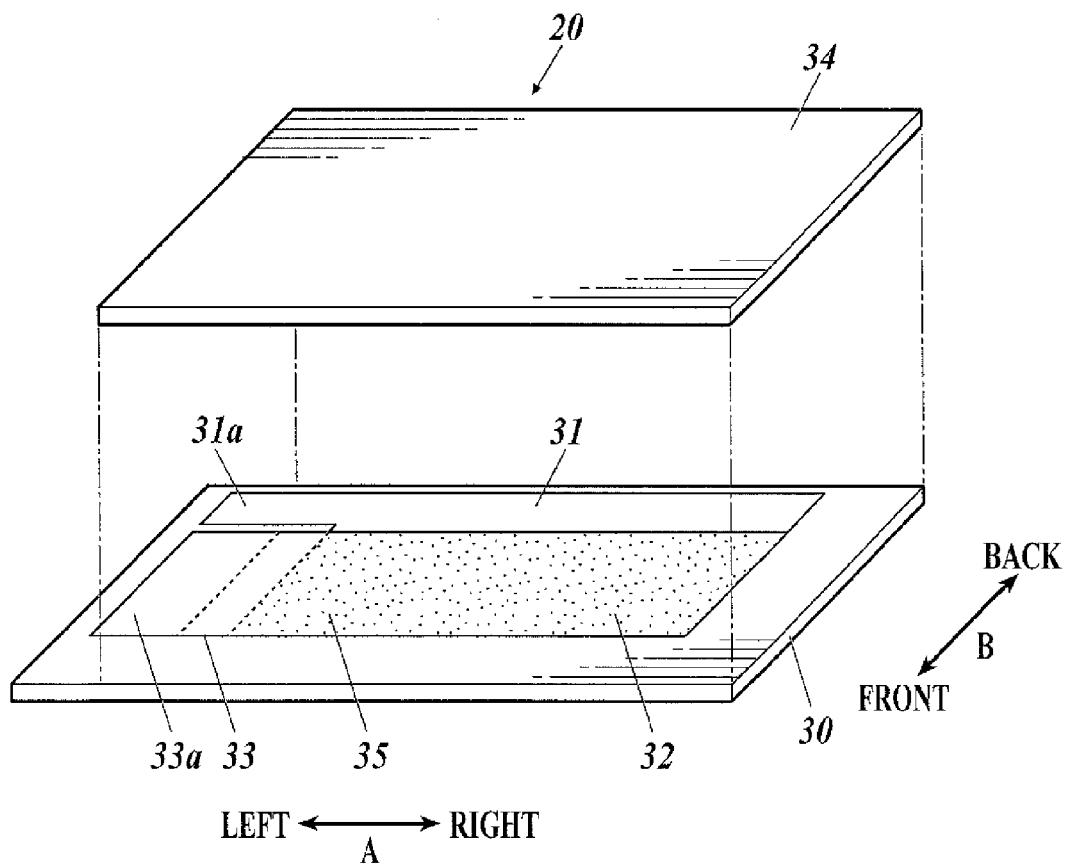
FIG. 2B is an exploded perspective view illustrating the schematic configuration of an organic EL panel in accordance with one or more embodiments of the invention.

As illustrated in FIGS. 2A and 2B, an organic EL panel 20 comprises a laminate in which a positive electrode 31, an organic compound layer 32 and a negative electrode 33 sequentially laminated on a support substrate 30, and a sealing member 34 that seals the laminate in accordance with one or more embodiments of the invention.

It is not required that the side faces (cutting surfaces) of the support substrate 30 are chamfered. They are fresh cutting surfaces, or they have been subjected to a treatment that does not impair the transparency.

Each of the support substrate 30 and the sealing member 34 is constituted by a transparent member.

The positive electrode 31, the organic compound layer 32 and the negative electrode 33 overlap with each other, and the overlap part serves as a light emitting part 35.

On the left part of the support substrate 30 in the left-right direction A, the positive electrode 31 and the negative electrode 33 are partly exposed from the sealing member 34 to serve respectively as power feed parts 31a and 33a so that the organic EL panel 20 can be connected to an external power supply (not shown) and an organic EL panel 21.

The organic EL panel 20 is configured such that light can be extracted from the side of the support substrate 30.

Organic EL panels 21 to 25 have the same configuration as the organic EL panel 20.

(Configuration of Organic EL Panel Group)

Figure 3:
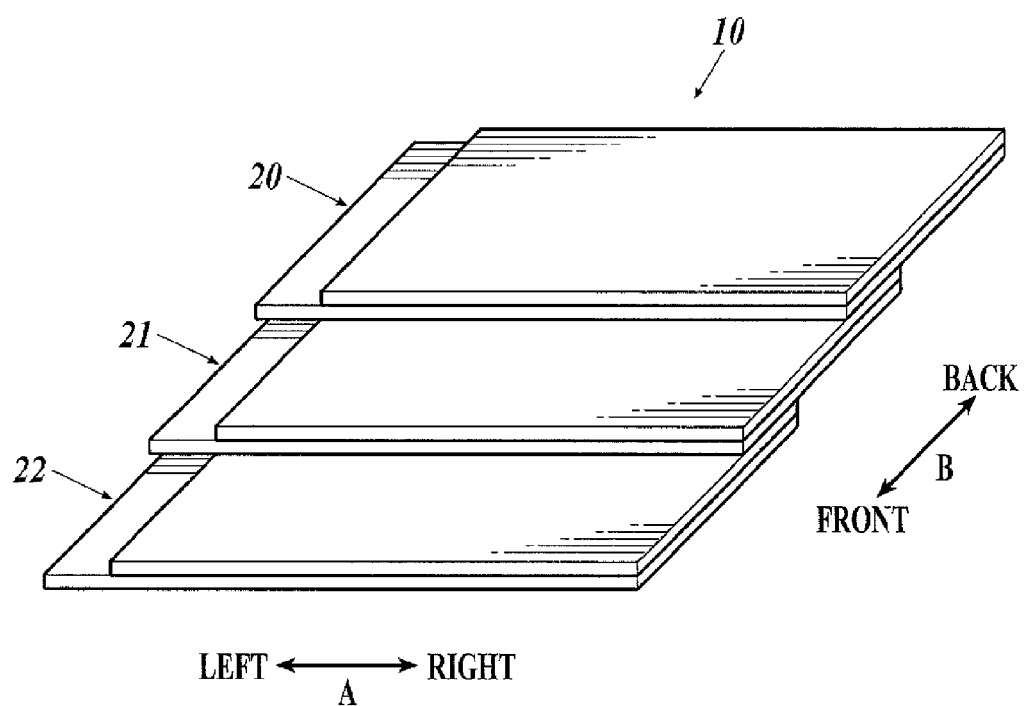
FIG. 3 is a perspective view illustrating the schematic configuration of an organic EL panel group in accordance with one or more embodiments of the invention.

As illustrated in FIG. 3, the organic EL panel group 10 is composed of the plurality of organic EL panels 20 to 22 in accordance with one or more embodiments of the invention. The organic EL panels 20 to 22 are laminated in a step-like shape in the front-back direction B. Specifically, they are laminated such that the front part of the organic EL panel 20 in the front-back direction B overlaps with the back part of the organic EL panel 21 in the front-back direction B, and the front part of the organic EL panel 21 in the front-back direction B overlaps with the back part of the organic EL panel 22 in the front-back direction R.

The organic EL panels 20 to 22 are joined to each other via adhesive.

The organic EL panel group 11 has the same configuration as the organic EL panel group 10.

Figure 4:
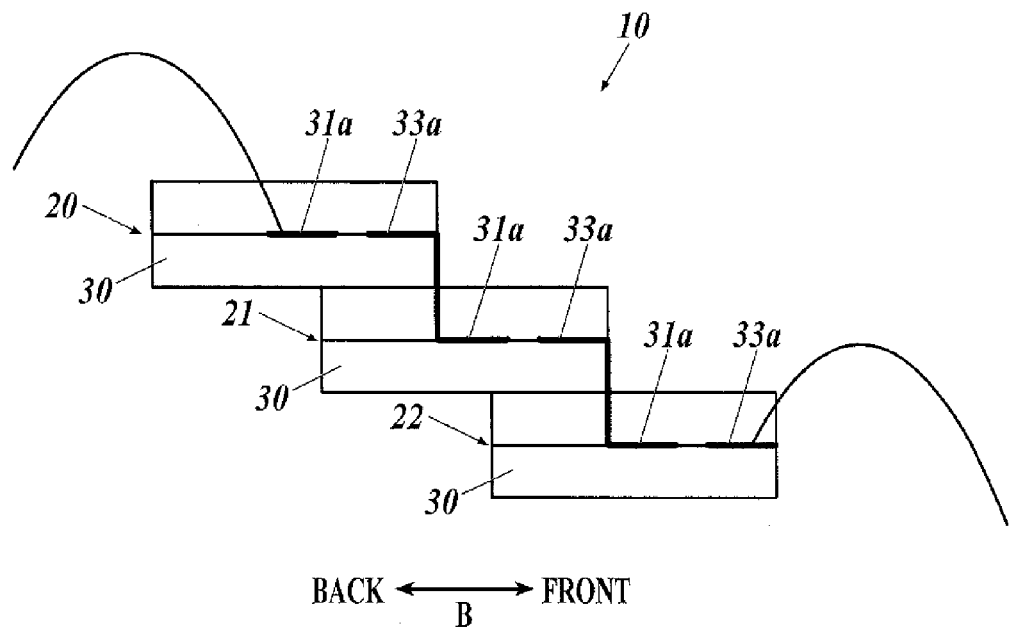
FIG. 4 is a side view illustrating a connection method of a light emitting panel in accordance with one or more embodiments of the invention.

As illustrated in FIG. 4, in the organic EL panel group 10, the neighboring organic EL panels 20 to 22 are electrically connected to each other via their power feed parts 31a and 33a. The power feed parts 31a and 33a that are not used for the connection between the organic EL panels 20 to 22 are connected to an external power supply (not shown).

A wiring of the organic EL panel group 10 for the connection is disposed at the left sides of the support substrates 30 and extends in the front-back direction B.

That is, as illustrated in FIG. 1, the power feed parts 31a and 33a of the organic EL panel group 10 are disposed in positions that allow the power feed parts 31a and 33a overlap with the laminates of the organic EL panels 23 to 25 of the adjacent organic EL panel group 11.

(Properties etc. of Light Emitting Panel)

As illustrated in FIG. 1, in the light emitting panel 1, the organic EL panel groups 10 and 11 are laminated and arranged in the left-right direction A.

Figure 5:
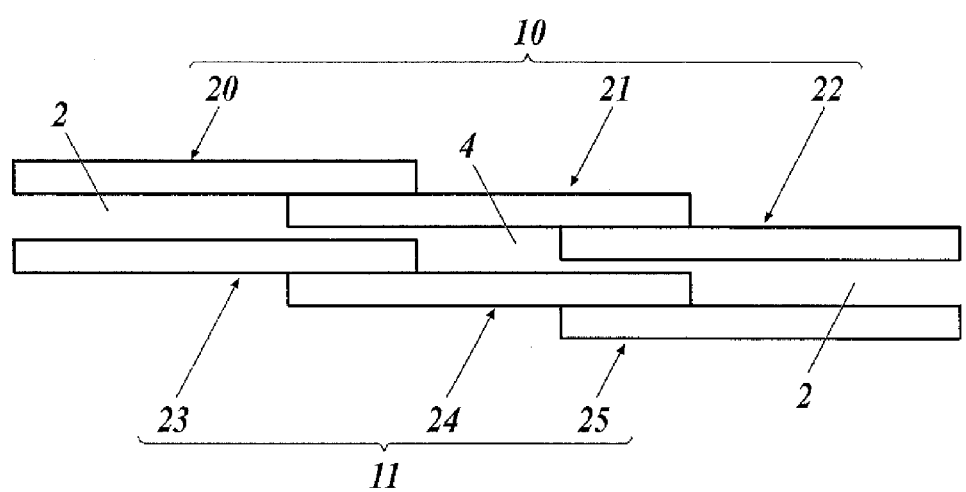
FIG. 5 is a side view illustrating the schematic configuration of a light emitting panel in accordance with one or more embodiments of the invention.

Between the organic EL panel groups 10 and 11 of the light emitting panel 1, spaces 2, 2 and 4 are formed as illustrated in FIG. 5.

The spaces 2 are formed between the organic EL panels 20 and 22 and between the organic EL panels 23 and 25, and have roughly the same thickness as the organic EL panel 20.

The space 4 is formed inside the organic EL panel groups 10 and 11, and is surrounded by the organic EL panels 21 to 24. The size of the space 4 can be suitably changed in accordance with one or more embodiments of the invention.

In the spaces 2, a glass substrate or the like may be inserted.

The space 4 may be filled with filler such as adhesive. In this case, since the filler serves as adhesive as well as fills the space 4, it can improve the strength of the light emitting panel 1.

As illustrated in FIG. 1, it is preferred that the overlap width W1 between the organic EL panel groups 10 and 11 in the left-right direction A and the overlap width W2 between the organic EL panels 20 to 22 or between the organic EL panels 23 to 25 in the front-back direction B are both at least three times, or at least seven times, or at least ten times greater than the total thickness of the support substrate 30 and the sealing member 34. Too narrow overlap widths W1 and W2 may cause breakage of the glass at the overlap portion.

The overlap width W1 may be equal to or narrower than half the width of the support substrate 30 in the left-right direction A, and the overlap width W2 is equal to or narrower than half the width of the support substrate 30 in the front-back direction B. If the overlap widths W1 and W2 are greater than half the width of the support substrate 30, six or more organic EL panels 20 overlap with each other in a certain area when a larger number of organic EL panels 20 are laminated in a step-like shape. Presence of such areas not only results in an increase of thickness but also may cause breakage of the glass that starts from the areas.

Figure 6:
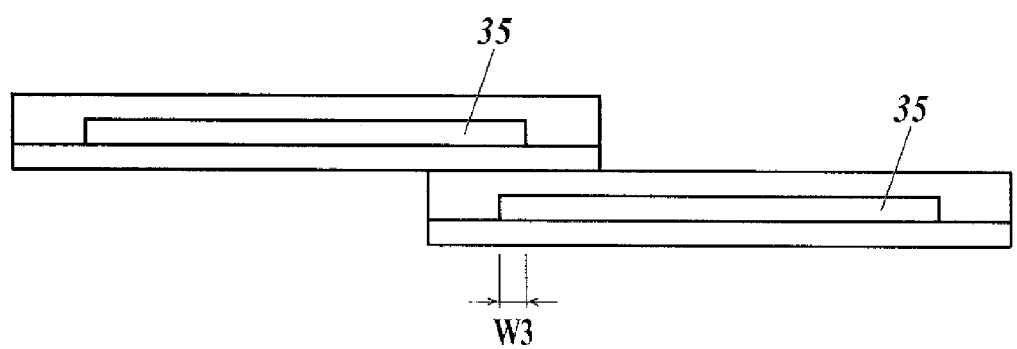
FIG. 6 is a schematic diagram illustrating a lamination structure of organic EL panels in accordance with one or more embodiments of the invention.

Further, the organic EL panels 20 to 25 may be laminated such that the light emitting parts 35 are arranged without any clearance between them and without any overlap with each other. However, since it is difficult to arrange the light emitting parts 35 without any clearance between them and without any overlap with each other, the light emitting parts 35 may slightly overlap with each other as illustrated in FIG. 6 in accordance with one or more embodiments of the invention.

Specifically, the overlap width W3 of the light emitting parts 35 may be equal to or less than 3 mm, equal to or less than 2 mm, or equal to or less than 1 mm. In terms of appearance, blight lines along the overlaps of the light emitting parts 35 are preferable to dark lines along the clearances between them.

Figure 7:
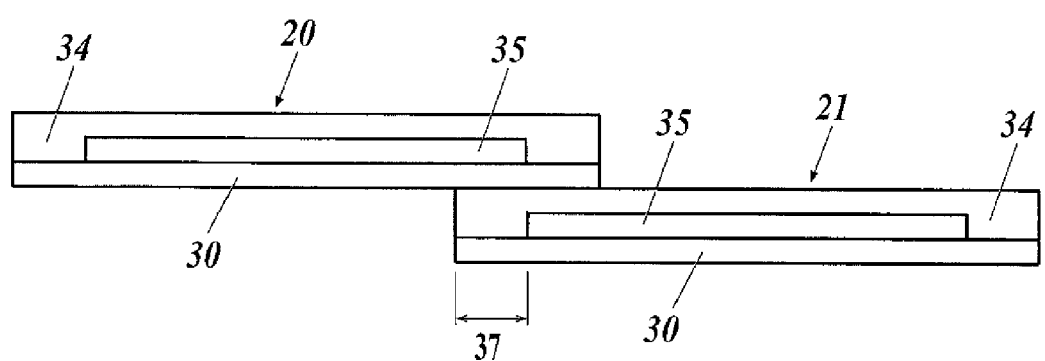
FIG. 7 is a schematic diagram illustrating a lamination structure of organic EL panels in accordance with one or more embodiments of the invention.

As illustrated in FIG. 7, when the organic EL panels 20 and 21 are laminated together, the support substrate 30 and the sealing member 34 of the organic EL panel 21 overlap with the light emitting part 35 of the organic EL panel 20. Accordingly, an overlap portion 37 of the support substrate 30 and the sealing member 34 of the organic EL panel 21, which overlaps with the light emitting part 35 of the organic EL panel 20, may have high light transmittance and does not include an electrode or the like.

Further, if a plurality of organic EL panels 20 are laminated together, each organic EL panel 20 may have high light transmittance at two of the four sides thereof, and that reflections or the like are not disposed there.

Accordingly, if a non-transparent electrode is used, at least two sides of the light emitting part 35 may be defined by the edges of the non-transparent electrode. By defining the light emitting part 35 by the edges of the non-transparent electrode, the non-transparent electrode does not extend out of the light emitting part 35 to the surrounding part thereof.

Figure 8:
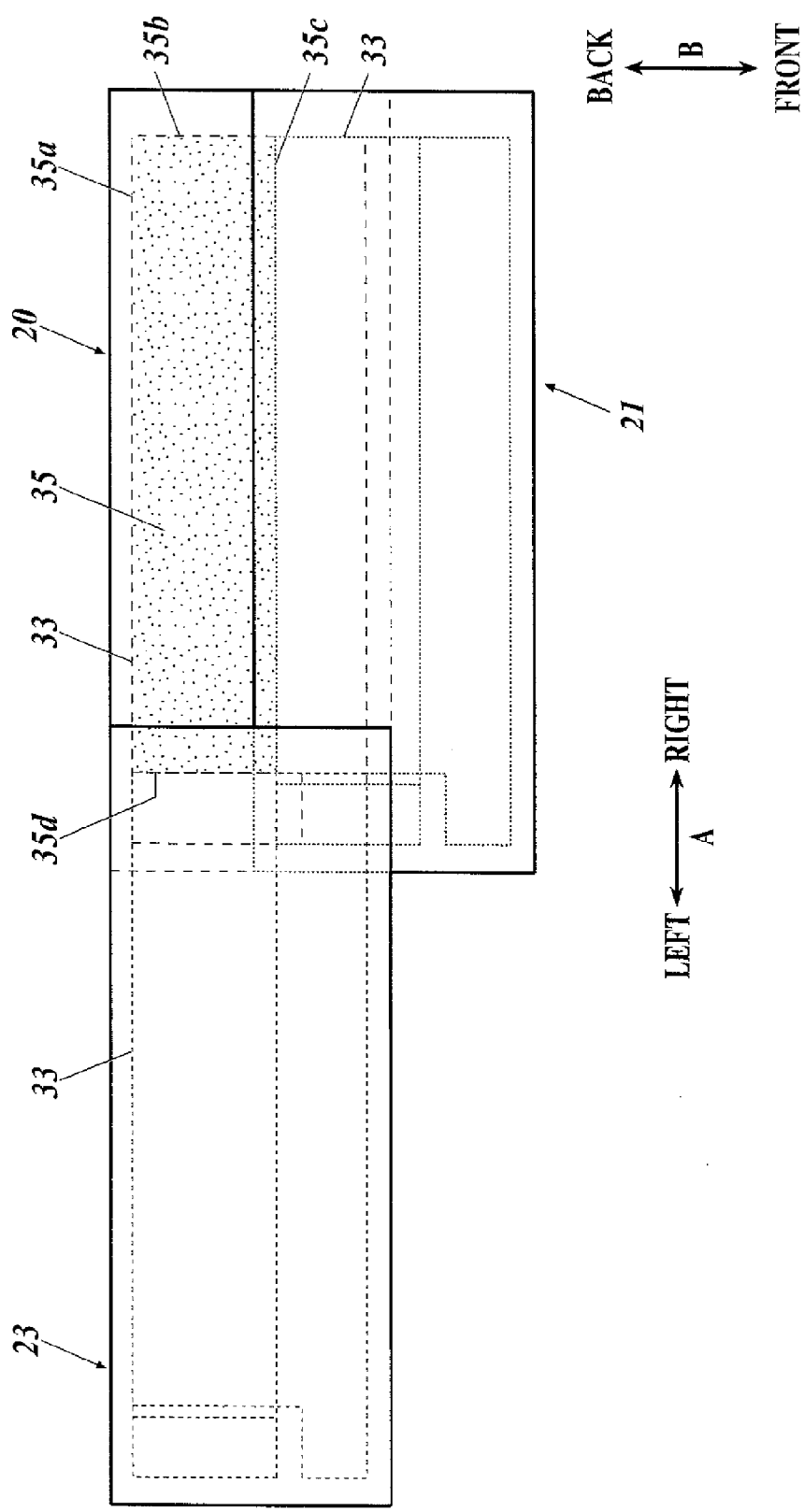
FIG. 8 is a bottom view of a light emitting panel in accordance with one or more embodiments of the invention.

Specifically, as illustrated in FIG. 8, three neighboring sides 35a, 35b and 35c of the light emitting part 35 of the organic EL panel 20 are defined by the negative electrode 33, i.e. a non-transparent electrode, of the organic EL panel 20 in accordance with one or more embodiments of the invention. A side 35d of the light emitting part 35 of the organic EL panel 20 is defined by the negative electrode 33 of the organic EL panel 23, which is a non-transparent electrode.

That is, since at least the two neighboring sides 35a and 35b of the light emitting parts 35 of the organic EL panels 20 to 25 are always defined by the negative electrodes 33, i.e. non-transparent electrodes, dark lines do not occur between the light emitting parts 35 when they are laminated in a step-like shape.

In terms of supplying electricity to the power feed parts 31a and 33a of the laminated light emitting panel 1, the power feed parts 31a and 33a may be collectively located on the same side. Furthermore, the power feed parts 31a and 33a may be formed in the areas that do not overlap with other organic EL panels 20 when they are laminated together.

Due to the inherent properties, transparent electrodes such as ITO have higher electrical resistance than metals. Accordingly, the organic EL panel 20 has problems with operation such as voltage loss in electricity supply and brightness distribution due to the voltage loss.

In accordance with one or more embodiments of the invention, in the organic EL panel 20, if the light emitting part 35 has a rectangular shape, in particular an oblong shape, the electrode having a longer power feed distance within the light emitting part 35 may be made of a low-resistance electrode.

Figure 9:
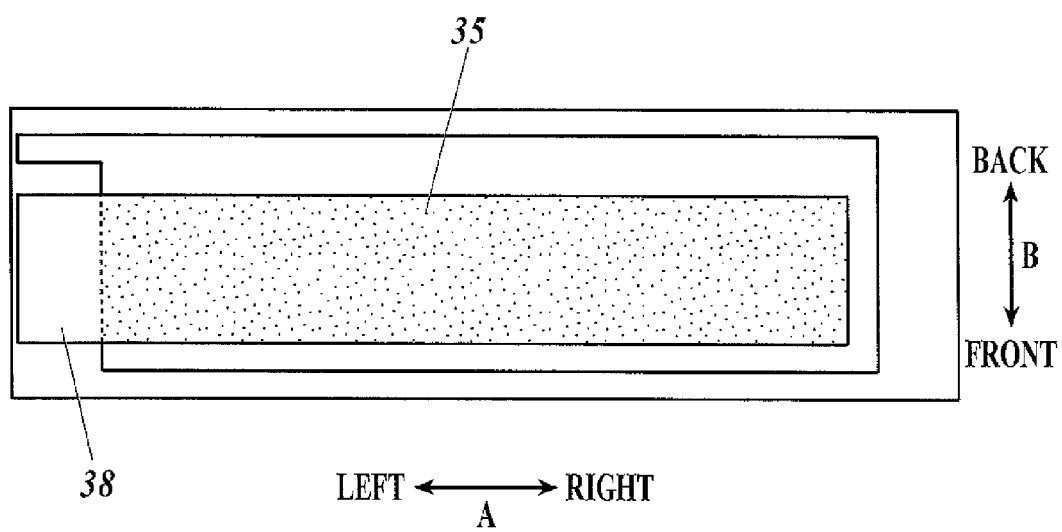
FIG. 9 is a plan view illustrating the schematic configuration of electrodes in accordance with one or more embodiments of the invention.

For example, as illustrated in FIG. 9, an electrode 38, which has a longer power feeding distance in the left-right direction A, may have low electrical resistance. In the light emitting panel 1, the negative electrode 33 is made of a low-electrical resistance metal.

(Auxiliary Electrode)

Figure 10A:
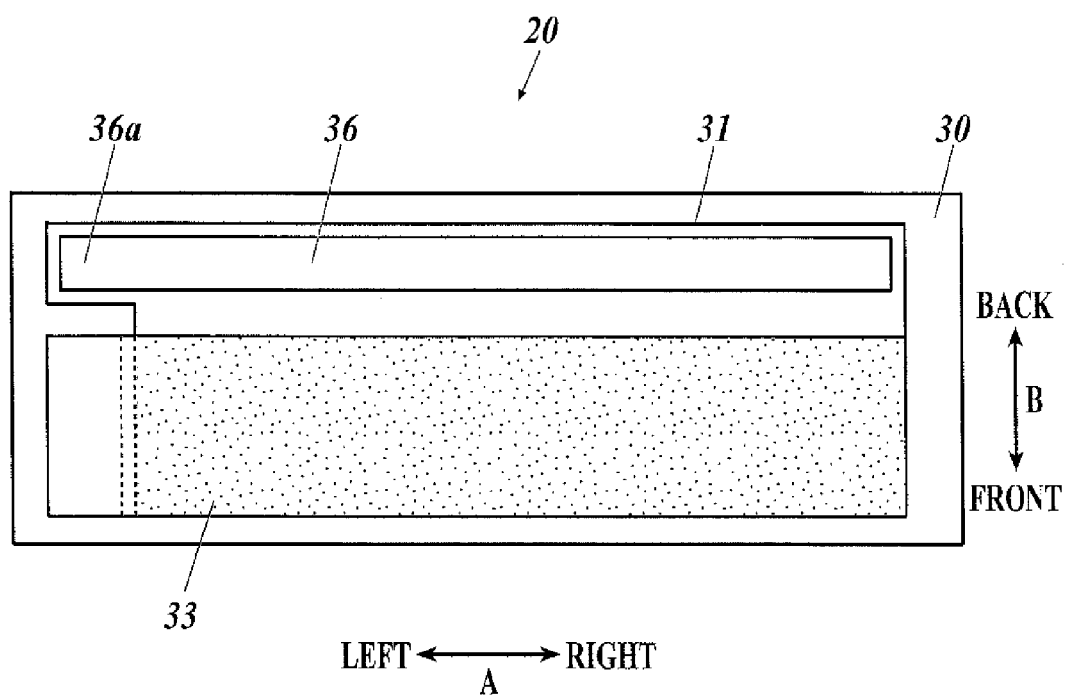
FIG. 10A is a plan view of an organic EL panel with a rectangular auxiliary electrode in accordance with one or more embodiments of the invention.

As illustrated in FIG. 10A, a rectangular (oblong) auxiliary electrode 36 of a low-electrical resistance metal may be formed in the back part of the positive electrode 31 in the front-back direction B in accordance with one or more embodiments of the invention.

The auxiliary electrode 36 serves as the positive electrode 31. In this case, instead of the power feed part 31a, the left part of the auxiliary electrode 36 in the left-right direction A serves as the power feed part 36a.

Low-electrical resistance metals as those used for the negative electrode 33 may be used for the auxiliary electrode 36. Specifically, examples of metals which can be used for the auxiliary electrode 36 include chromium and the alloys thereof, silver and the alloys thereof (silver-palladium, silver-palladium-copper and the like), aluminum and the alloys thereof, copper and the alloys thereof, gold and the alloys thereof, molybdenum and the alloys thereof, and the like. In one or more embodiments, a metal different from the metal of the negative electrode 33 may be laminated and used.

The auxiliary electrode 36 may be formed by sputtering or the like before or after forming the film of the negative electrode 31. Alternatively, the auxiliary electrode 36 may be formed by forming a metal film by means of vapor deposition or the like simultaneously with or before or after forming the film of the negative electrode 33. To reduce the process, the film may be formed simultaneously with forming the film of the negative electrode 33.

(Sealing)

Sealing may be achieved by any method such as can encapsulation, solid contact sealing and frit sealing. In terms of uniformity of transparency, solid contact sealing is preferred.

(Method for Manufacturing Light Emitting Panel)

A method for manufacturing a light emitting panel 1 that includes organic EL elements each composed of a positive electrode/a hole injecting layer/a hole transporting layer/a light emitting layer/an electron transporting layer/a negative electrode in accordance with one or more embodiments of the invention will be described.

Figure 11:
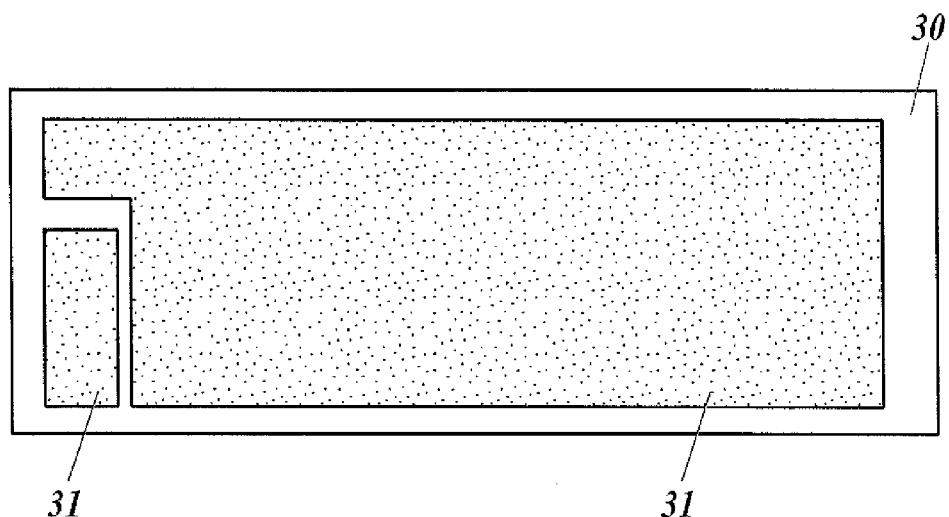
FIG. 11 is a plan view schematically illustrating one step of a method for manufacturing a light emitting panel in accordance with one or more embodiments of the invention.

First, as illustrated in FIG. 11, the positive electrode 31 is formed by forming a thin film of a desired electrode material, e.g. positive electrode material, on a transparent support substrate 30 to a film thickness of 1 or less, or from 10 nm to 300 nm by means of vapor deposition, sputtering or the like.

Figure 12:
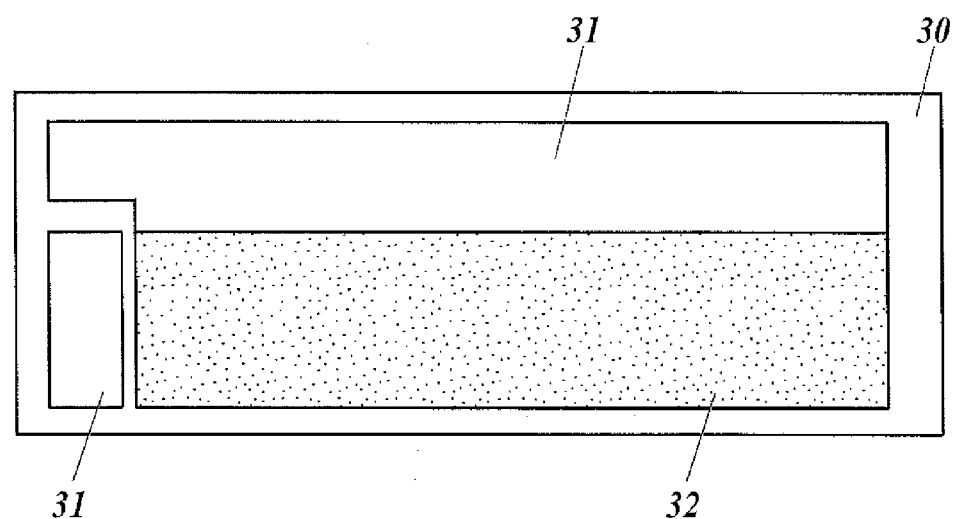
FIG. 12 is a plan view schematically illustrating the subsequent step of FIG. 11 in accordance with one or more embodiments of the invention.

Next, as illustrated in FIG. 12, an organic compound layer 32, which is composed of the hole injecting layer, the hole transporting layer, the light emitting layer and the electron transporting layer, is formed thereon.

Examples of methods for forming the thin film of the organic compound layer 32 include vapor deposition, wet processes (spin coating, casting, inkjet printing, printing, LB (Langmuir-Blodgett) method, spraying, printing, slot die coating) and the like. Among them, vacuum vapor deposition, spin coating, inkjet printing, printing and slot die coating may be used because these methods are advantageous in that a uniform film can be easily obtained, pin holes are less formed, etc. In one or more embodiments, each layer may be formed by a different film forming method.

Figure 13A:
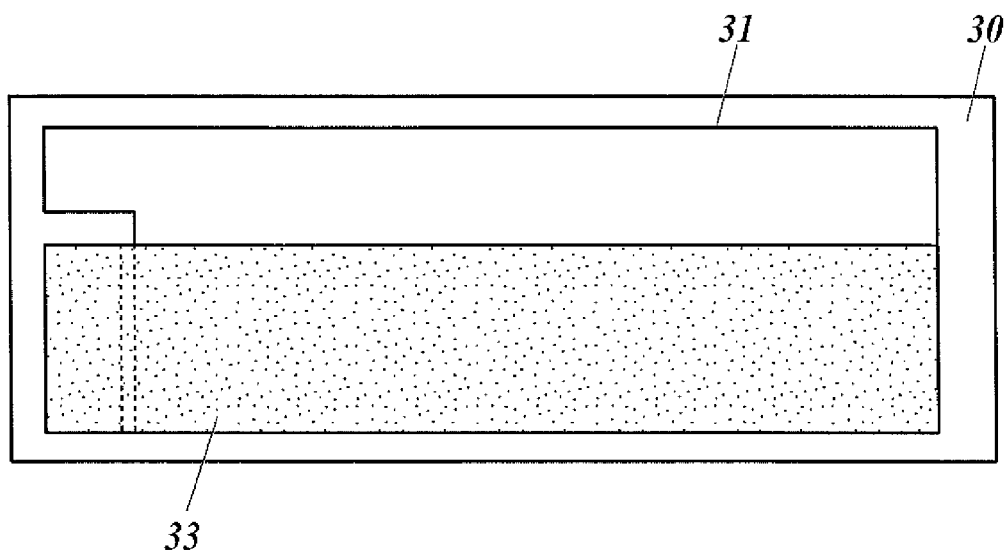
FIG. 13A is a plan view schematically illustrating the subsequent step of FIG. 12 in accordance with one or more embodiments of the invention.

After forming these layers, the negative electrode 33 is formed thereon by laying a negative electrode material as illustrated in FIG. 13A, for example, by vapor deposition, sputtering or the like.

Figure 13B:
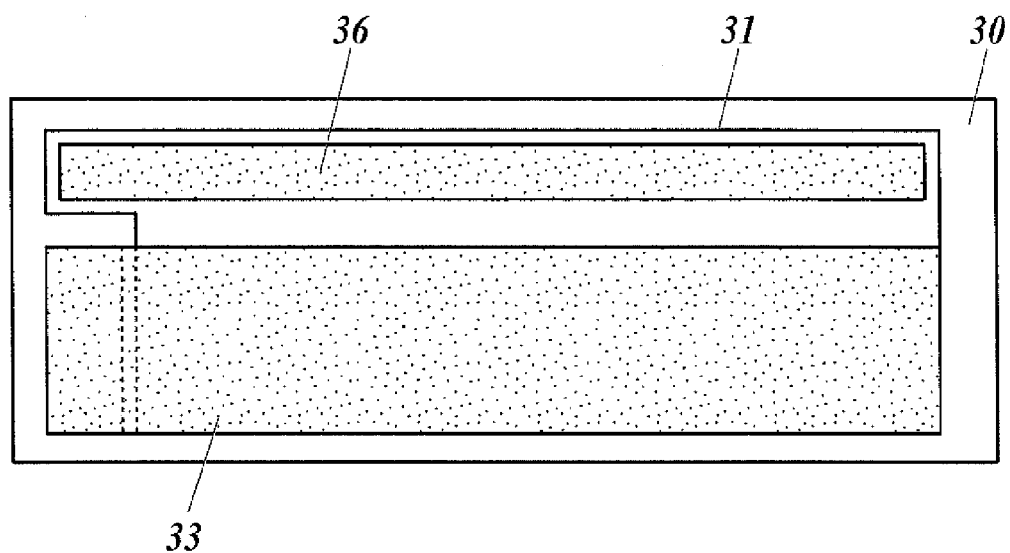
FIG. 13B is a plan view schematically illustrating the subsequent step of FIG. 12 in accordance with one or more embodiments of the invention.

As illustrated in FIG. 13B, the auxiliary electrode 36 may be formed simultaneously with the negative electrode 33 in accordance with one or more embodiments of the invention.

Next, after applying adhesive on the transparent sealing member 34, it is pasted on the face of the prepared organic EL element where the negative electrode 33 is disposed. The organic EL panel 20 is thus obtained.

Figure 14:
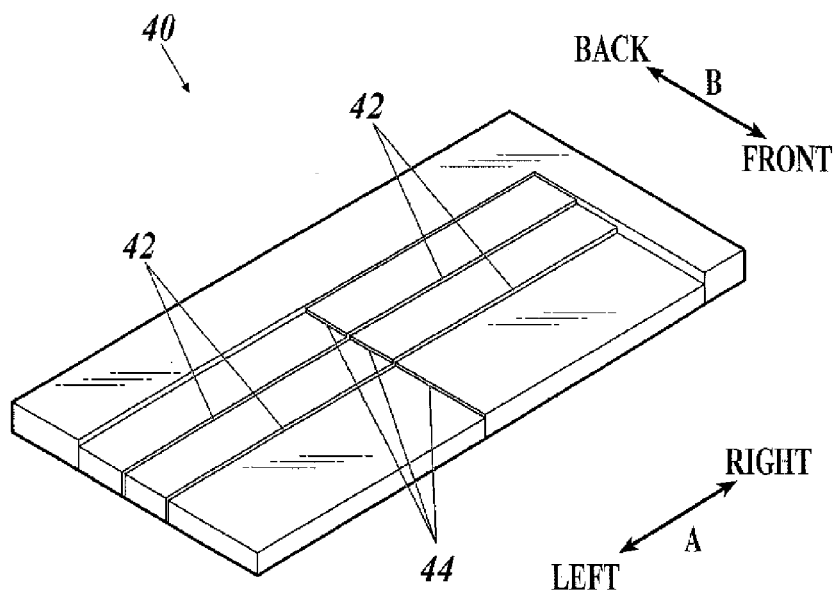
FIG. 14 is a perspective view illustrating the schematic configuration of a jig in accordance with one or more embodiments of the invention.

Next, as illustrated in FIG. 14, the plurality of organic EL panels 20 to 25 are mounted on a jig 40 having stepped grooves and are arranged in the left-right direction A and in the front-back direction B such that the power feed parts 31a and 33a are aligned on the left sides of the organic EL panel groups 10 and 11 in the left-right direction A. In this step, the organic EL panels 20 to 25 are fixed by suction, adhesive is laid to fill the overlap portions between the organic EL panels 20 to 25, and the adhesive is cured while the panels are being held by the jig 40.

The height of steps 42 of the jig 40 is roughly equal to the total thickness of the support substrate 30 and the sealing member 34 of the organic EL panel 20, and the height of steps 44 is roughly as twice as the height of the steps 42. Fine adjustment is suitably made according to the thickness of the adhesive and the like.

Figure 15:
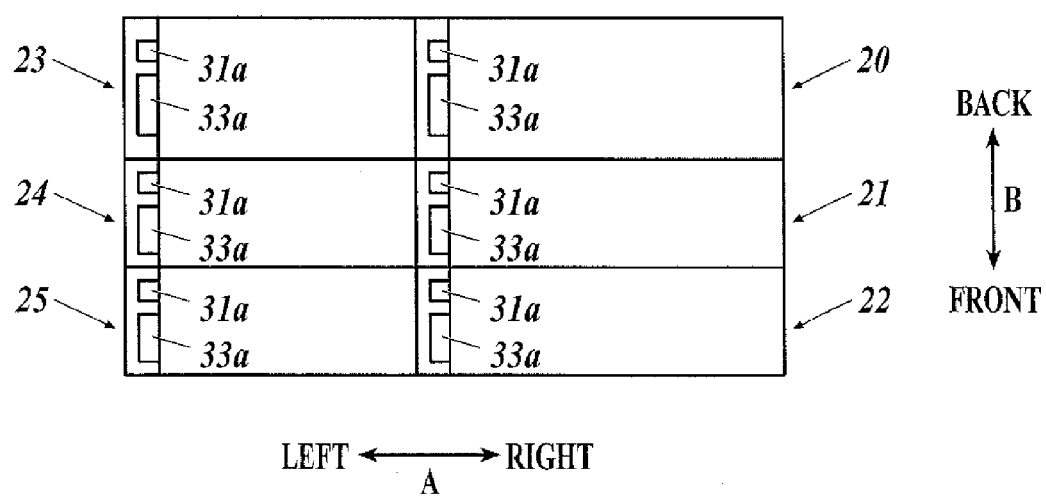
FIG. 15 is a plan view illustrating the schematic configuration of a plurality of organic EL panels in accordance with one or more embodiments of the invention.

Next, the joined plurality of organic EL panels 20 to 25 are dismounted from the jig 40. In accordance with one or more embodiments of the invention, as illustrated in FIG. 15, the power feed parts 31a and the power feed parts 33a are alternately disposed in each set of the organic EL panels 20 to 22 and the organic EL panels 23 to 25.

By using a transparent material, the jig 40 may be used as a protection plate without being removed from the organic EL panels 20 to 25.

Figure 16:
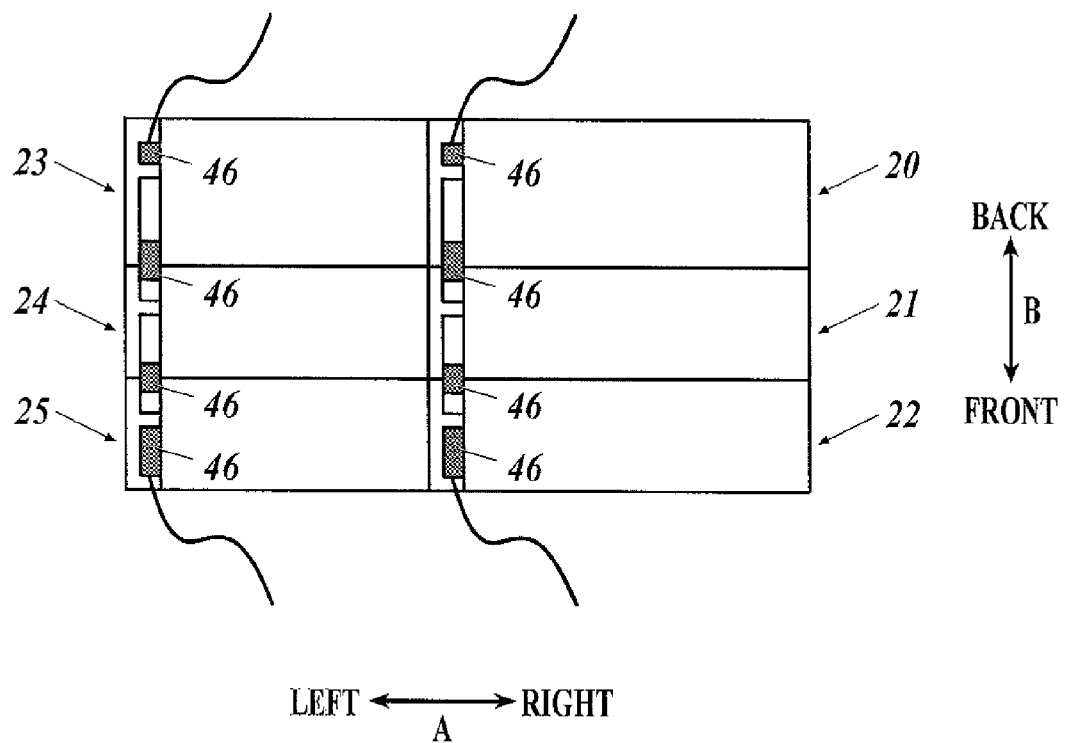
FIG. 16 is a plan view schematically illustrating the subsequent step of FIG. 13A in accordance with one or more embodiments of the invention.

Lastly, as illustrated in FIG. 16, the power feed parts 31a and power feed parts 33a of the organic EL panels 20 to 22 as well as the power feed parts 31a and power feed parts 33a of the organic EL panels 23 to 25 are electrically connected to each other by copper foil tapes 46 or the like. The light emitting panel 1 is thus obtained.

The copper tapes 46 or the like that are pasted to the power feed parts 31a of the outer organic EL panels 20 and 23 and the power feed parts 33a of the outer organic EL panels 22 and 25 have soldered power feeding lines, which are connected to an external power supply.

Figure 17A:
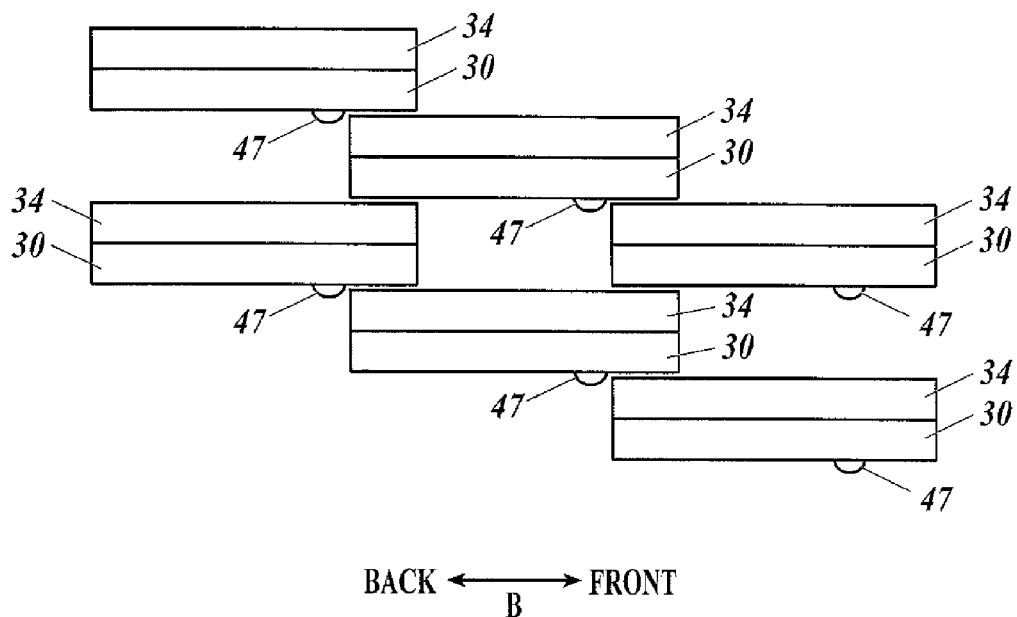
FIG. 17A is a side view illustrating the schematic configuration of a light emitting panel in accordance with one or more embodiments of the invention.
Figure 17B:
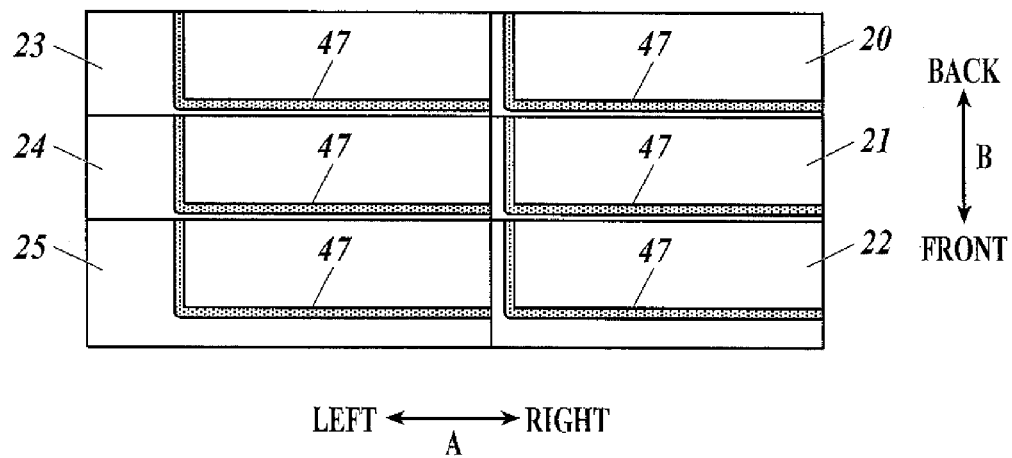
FIG. 17B is a bottom view illustrating the schematic configuration of the light emitting panel in accordance with one or more embodiments of the invention.

In the above-described step of joining the plurality of organic EL panels 20 to 25, the positioning may be carried out by not using the jig 40 but using adhesive. Specifically, in accordance with one or more embodiments of the invention, as illustrated in FIGS. 17A and 17B, adhesive 47 is applied and cured in an L-shape on the support substrates 30 on the side opposite to the sealing members 34 so that the overlap widths W1 and W2 are defined. Then, on the basis of their positions, the organic EL panels 20 to 25 are overlapped and joined to each other.

The adhesive 47 may be the same or different from the adhesive that joins the organic EL panels 20 to 25 to each other.

Figure 18A:
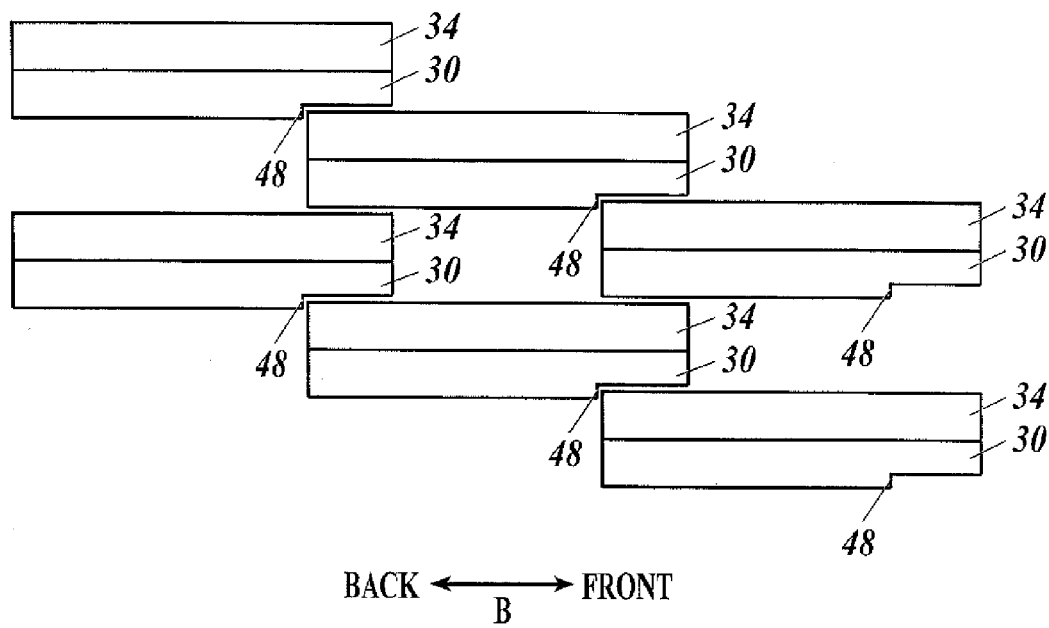
FIG. 18A is a side view illustrating the schematic configuration of a light emitting panel in accordance with one or more embodiments of the invention.
Figure 18B:
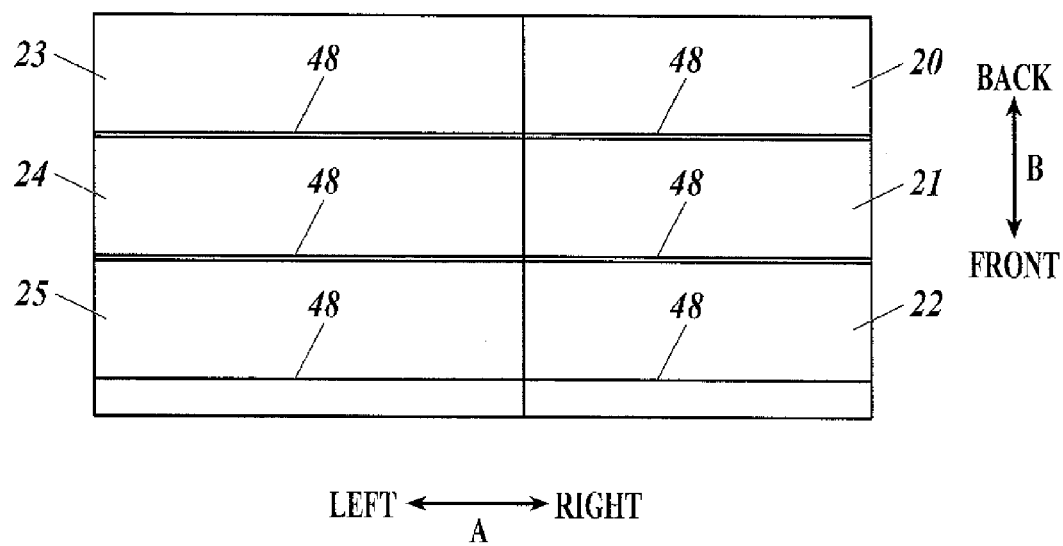
FIG. 18B is a bottom view illustrating the schematic configuration of the light emitting panel in accordance with one or more embodiments of the invention.

Alternatively, as illustrated in FIGS. 18A and 18B, steps 48 in the left-right direction A may be previously formed on the support substrates 30 on the side opposite to the sealing members 34, and the organic EL panels 20 to 25 may be overlapped and joined to each other on the basis of the positions of the steps 48 in accordance with one or more embodiments of the invention.

The steps 48 may be formed by etching or the like on the support substrates 30. Alternatively, two support substrates 30 with different sizes may be pasted together to form the steps 48.

In the above-described present embodiment, the adhesive applied on the joining portions between the organic EL panels 20 improves the strength against external stresses, which enables the manufacture of the large-area light emitting panel 1 with high strength without using a holder plate, which is described in Patent Document 1. Using transparent members for the support substrates 30 and the sealing members 34 allows the above-described tiling as well as high sealing performance.

Further, since the glass plates or filler can be inserted in the spaces 2 and 4, which are formed between the organic EL panel groups 10 and 11, the strength of the light emitting panel 1 can be further improved.

Further, if the rectangular auxiliary electrodes 36 are provided, the uneven brightness can be further reduced compared to a panel without the auxiliary electrodes 36, because the auxiliary electrodes 36 are made of a low-electrical resistance metal.

Further, since the power feed parts 31a (36a) and 33a of the organic EL panel 20 are collectively disposed on the same side, the wiring can be disposed at the left side of the support substrate 30 and can be extended in the front-back direction B when the organic EL panel 20 is laminated in a step-like shape. Therefore, it is not required to provide, for example, a power feed part or the like on the sealing member 35 opposite the organic compound layer 32 like the prior art.

Further, since the light emitting panel 1 has a rectangular shape, it is easily fitted in building materials and the like and also has a good appearance.

Furthermore, the shape of the auxiliary electrode 36 may be any of the shapes as illustrated in FIGS. 19A to 21 (see Variations 1-1 to 1-3).

(Variation 1-1)

In one or more embodiments of the invention, as another shape of the auxiliary electrode 36, a slit may be formed in the left-right direction A.

Figure 19A:
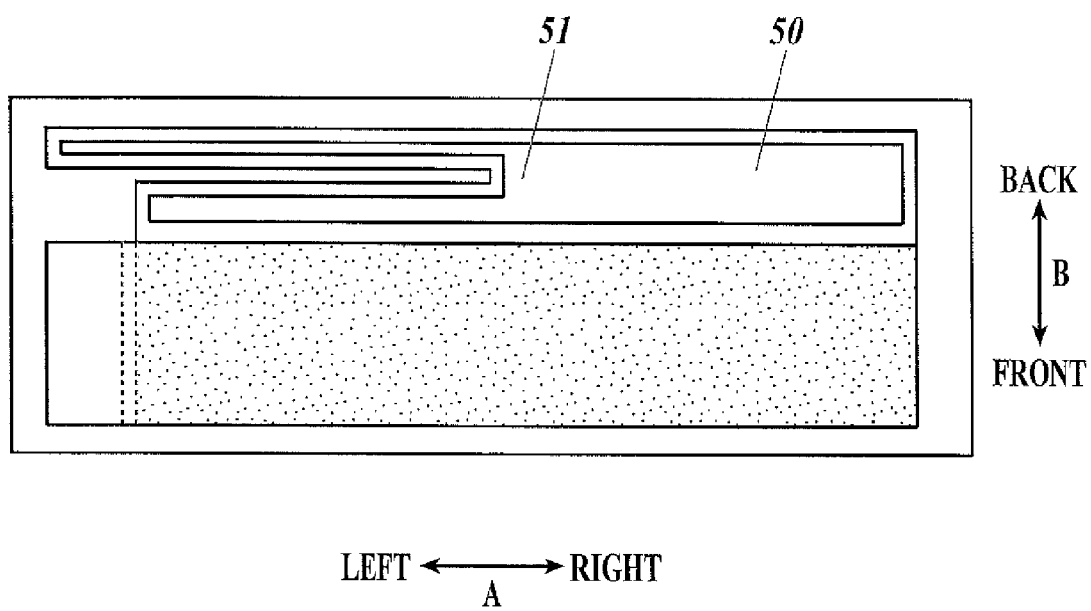
FIG. 19A is a plan view illustrating the schematic configuration of Variation 1-1 of the organic EL panel of FIG. 10A in accordance with one or more embodiments of the invention.

The slit may have any shape. For example, an auxiliary electrode 50 with a rectangular slit as illustrated in FIG. 19A may be used.

The slit auxiliary electrode 50 is manufactured from the same material by the same method as those of the auxiliary electrode 36.

This above-described variation can effectively prevent uneven brightness that is caused by a voltage drop while electricity is supplied.

Figure 10B:
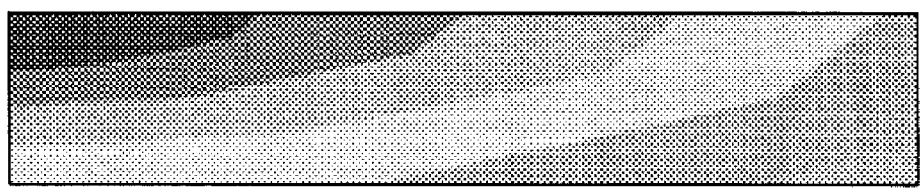
FIG. 10B is a brightness distribution chart of the organic EL panel with the rectangular auxiliary electrode in accordance with one or more embodiments of the invention.

Specifically, when the rectangular auxiliary electrode 36 was used, the observed brightness ranged over six levels as illustrated in FIG. 10B. This means that the area near the power feed part 36a is brighter while the area away from the power feed part 36a is darker. One of the reasons is that an electric current flows less easily as the distance from the power feed part 36a increases since the auxiliary electrode 36 has a constant width over the left-right direction A although it is made of a low-electrical resistance metal.

Figure 19B:
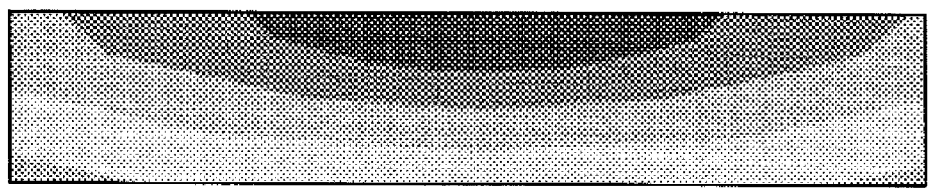
FIG. 19B is a brightness distribution chart of Variation 1-1 of the organic EL panel of FIG. 10A in accordance with one or more embodiments of the invention.

In contrast, when the slit auxiliary electrode 50 was used, the observed brightness ranged over five levels as illustrated in FIG. 19B. A conceivable reason is that the slit of the auxiliary electrode 50 creates a condition as if electricity were supplied from a branch point 51 located at the center of the auxiliary electrode 50 in the left-right direction A.

(Variation 1-2)

In one or more embodiments of the invention, as another shape of the auxiliary electrode 36, the distance from the light emitting part 35 may gradually decrease from the left side to the right side in the left-right direction A.

Figure 20A:
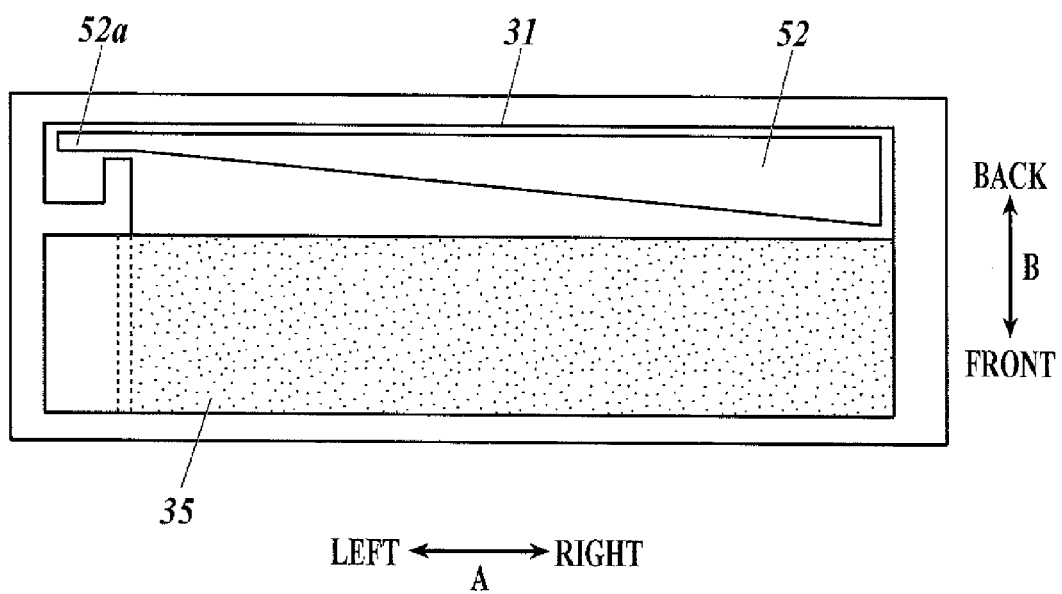
FIG. 20A is a plan view illustrating the schematic configuration of Variation 1-2 of the organic EL panel of FIG. 10A in accordance with one or more embodiments of the invention.

An example thereof is a trapezoidal auxiliary electrode 52 as illustrated in FIG. 20A.

The auxiliary electrode 52 is manufactured from the same material by the same method as those of the auxiliary electrode 36.

The distance from the auxiliary electrode 52 to the light emitting element 35 (the width of the part where only the positive electrode 31 exists) may be optimized by calculating the ratio of sheet resistance between the positive electrode 31 and the auxiliary electrode 52, the width of the light emitting area and the like.

This above-described variation can effectively prevent the uneven brightness that is caused by a voltage drop while electricity is supplied in accordance with one or more embodiments of the invention.

Figure 20B:
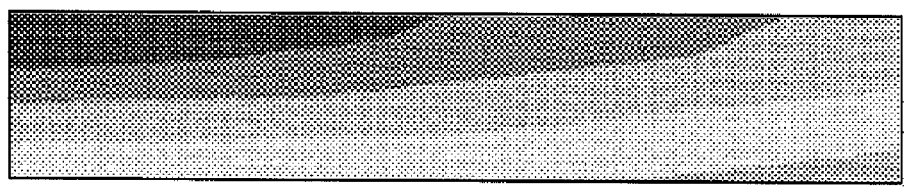
FIG. 20B is a brightness distribution chart of Variation 1-2 of the organic EL panel of FIG. 10A in accordance with one or more embodiments of the invention.

That is, when the trapezoidal auxiliary electrode 52 was used, the observed brightness ranged over five levels as illustrated in FIG. 20B. A conceivable reason is that the inclination of the front side of the auxiliary electrode 52 in the front-back direction B makes it more difficult for an electric current to flow to the light emitting part 35 in the area near the power feed part 52a of the auxiliary electrode 52 because of the high electrical resistance of ITO (positive electrode 31). In contrast, the width of ITO, which has high electrical resistance, gradually decreases as the distance from the power feed part 52a increases, which makes it easier for an electric current to flow to the light emitting part 35.

(Variation 1-3)

In one or more embodiments of the invention, as another shape of the auxiliary electrode 36, the distance from the light emitting part 35 may gradually decrease from the left side to the right side in the left-right direction A.

Figure 21:
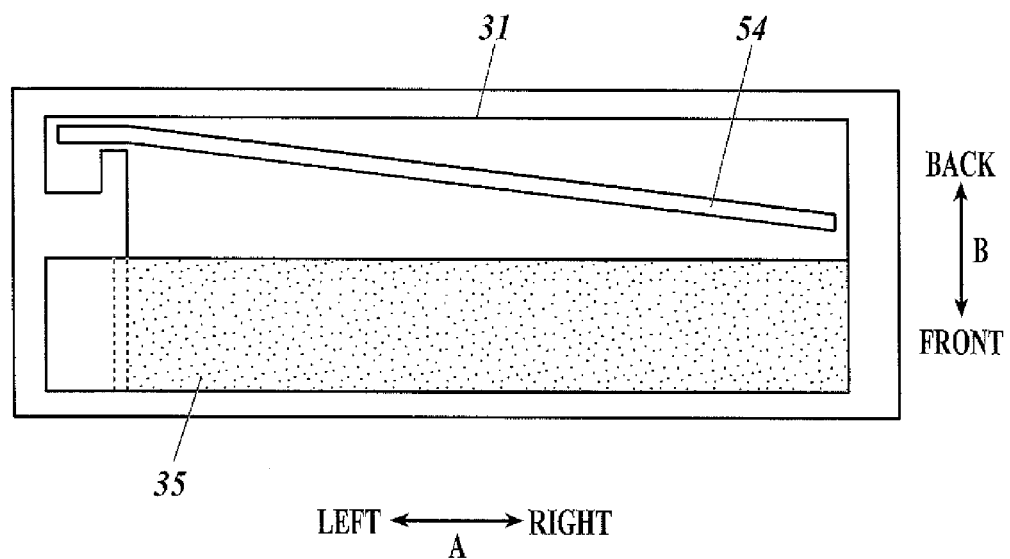
FIG. 21 is a plan view illustrating the schematic configuration of Variation 1-3 of the organic EL panel of FIG. 10A in accordance with one or more embodiments of the invention.

An example thereof is a diagonal auxiliary electrode 54 as illustrated in FIG. 21.

The auxiliary electrode 54 is manufactured from the same material by the same method as those of the auxiliary electrode 36.

If the diagonal auxiliary electrode 54 is used, the width of the auxiliary electrode 54 is suitably selected according to the specific resistance of the material, the film thickness and the like of the auxiliary electrode 54. The auxiliary electrode 54 may not be too narrow because an increase of the resistance causes an increase of the drive voltage.

Further, the distance from the auxiliary electrode 54 to the light emitting part 35 (width of the part composed of only the positive electrode 31) may be optimized by calculating the ratio of sheet resistance between the positive electrode 31 and the auxiliary electrode 54, the width of the light emitting area and the like.

By this above-described variation, the same advantageous effects as those of Variation 1-2 can be obtained.

Hereinafter, specific effects of embodiments of the invention will be described with examples. However, the embodiments of the present invention are not limited thereto.

Example 1

(1) Manufacture of Light Emitting Panel 1-1

As the transparent support substrate, a transparent glass substrate (EAGLE XG (alkali-free glass), Corning Inc.) having a thickness of 0.7 mm and a size of 66 mm×175 mm was prepared. On the substrate, an ITO film was formed to a thickness of 150 nm as the positive electrode.

After being patterned by a photolithography process, the substrate with the ITO film was subject to ultrasonic cleaning in isopropyl alcohol, was dried in dry nitrogen gas, and was subject to UV ozone cleaning for 5 minutes.

Next, as the hole injecting layer, CLEVIOS P VP A14083 (Heraeus Clevios Co.) was applied on the substrate using a commercial spin coater so that the dried film thickness becomes 30 nm.

Thereafter, the substrate was heated at 200° C. in the air for 1 hour.

Next, the transparent substrate, on which the hole injecting layer had been formed, was fixed on a substrate holder of a vacuum deposition apparatus, and a deposition mask was set facing the face of the transparent substrate where the positive electrode is to be formed. Also, deposition boats in the vacuum deposition apparatus were respectively filled with the materials of the organic light emitting layer and the negative electrode in the amounts optimal for forming the respective layers. The deposition boats used were made of a molybdenum- or tungsten-based material for resistance heating.

Thereafter, the pressure in the deposition chamber of the vacuum deposition apparatus was reduced to a degree of vacuum of $4\times10^{-4}$ Pa, and the deposition boats containing the materials were sequentially heated by applying electricity so that the respective layers were formed as follows.

First, the α-NPD of the following structural formula, which serves as a hole transporting material, was deposited on the hole injecting layer at a deposition rate of 0.1 nm/sec, so that a hole transporting layer having a film thickness of 25 nm was provided.

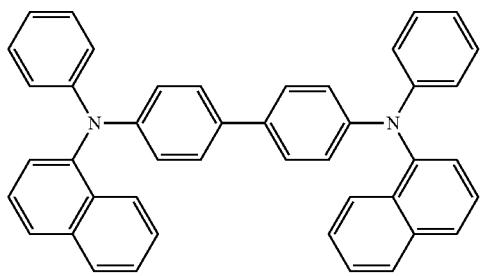 [SMILES: c1ccc(N(c2ccc(-c3ccc(N(c4ccccc4)c4cccc5ccccc45)cc3)cc2)c2cccc3ccccc23)cc1]

Then, the compound of the following structural formula D-B, which serves as a green guest material, the compound of the following structural formula D-C, which serves as a red guest material, and the compound of the following structural formula H-A, which serves as a host material, were co-deposited on a blue light emitting layer at a total deposition rate of 0.1 nm/sec, so that a yellow light emitting layer having a film thickness of 10 nm, containing 10 mass % of D-B and 2 mass % of D-C, was provided.

Then, the compound of the following structural formula D-A, which serves as a blue guest material, and the compound of the following structural formula H-A, which serves as a host material, were co-deposited on the hole transporting layer at a total deposition rate of 0.1 nm/sec, so that a blue light emitting layer having a film thickness of 15 nm, containing 10 mass % of D-A, was provided.

H-A

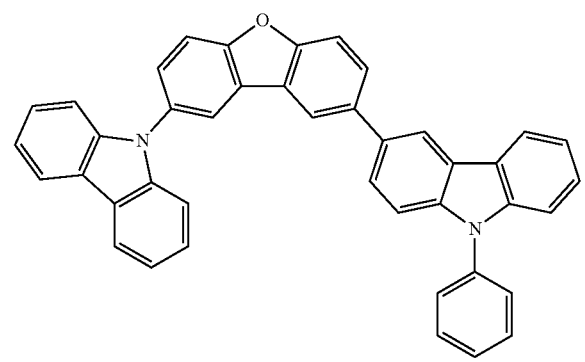

D-A

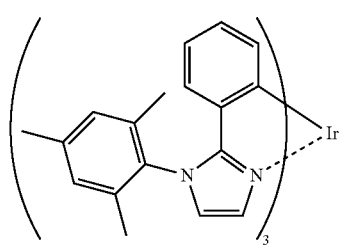

D-B

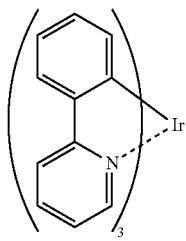

D-C

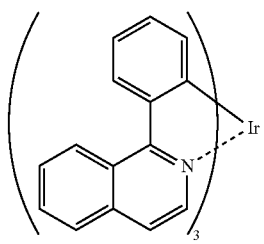

Then, the following compound, which serves as a hole blocking material, was deposited at a deposition rate of 0.05 nm/sec so that a hole blocking layer having a film thickness of 5 nm was provided.

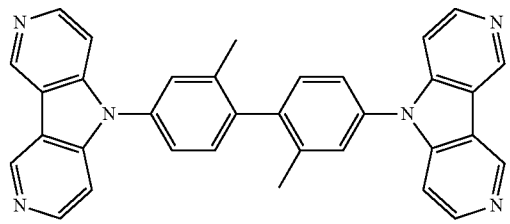 [SMILES: Cc1cc(-n2c3ccncc3c3cnccc32)ccc1-c1ccc(-n2c3ccncc3c3cnccc32)cc1C]

Then, the following compound, which serves as an electron transporting material, was deposited at a deposition rate of 0.1 nm/sec, so that an electron transporting material having a film thickness of 45 nm was provided.

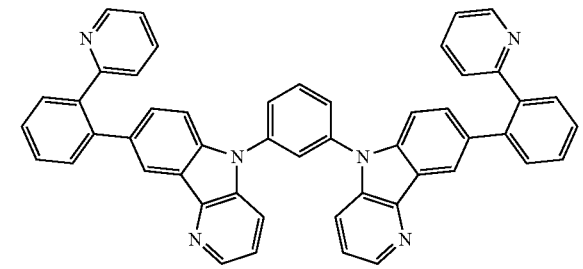 [SMILES: c1ccc(-c2ccccc2-c2ccc3c(c2)c2ncccc2n3-c2cccc(-n3c4ccc(-c5ccccc5-c5ccccn5)cc4c4ncccc43)c2)nc1]

Furthermore, lithium fluoride (LiF), which serves as an electron injecting material, was deposited on the electron transporting layer at a deposition rate of 0.1 nm/sec, so that an electron injecting layer having a film thickness of 1 nm was provided.

Lastly, aluminum (Al), which serves as a negative electrode material, was deposited on the electron injecting layer so that a negative electrode having a film thickness of 110 nm was formed. The organic EL element was thus manufactured.

Next, as the sealing member, 1.1 mm thick alkali-free glass (EAGLE XG, Corning Inc.) was cut into 66×167 mm, and a recess having a size of 0.4 mm in depth, 60 mm in length and 161 mm in width was formed thereon by etching.

Ultraviolet-curable adhesive was applied on the peripheral bump of the sealing member, and a desiccant for organic EL (Japan Gore-Tex Co.) was pasted in the recess.

The sealing member and the prepared organic EL element were pasted together, and were irradiated with ultraviolet ray using a high pressure mercury lamp to cure the adhesive. Each of the organic EL panels was thus manufactured.

Next, the organic EL panels were mounted on a jig having a step-like shape, and silicone adhesive (one-pack RTV rubber KE-347T, Shin-Etsu Chemical Co., Ltd.) was provided to fill the gaps between the organic EL panels while the panels were being fixed by suction, so that 12 organic EL panels in total were assembled together. These 12 organic EL panels were held on the jig for 30 minutes until the adhesive was cured. The steps 42 of the jig was 1.8 mm high, and the steps 44 were 3.6 mm high, which were suitably adjusted according to the thickness of the adhesive or the like.

The jig was designed so that the overlap width W1 became 33 mm, the overlap width W2 became 40.5 mm, and the overlap width W3 became 0.5 mm.

The panel assembly in which 12 panels are bonded to each other was taken out of the jig, and a copper foil tape (reverse-embossed copper foil tape No. 3245, Sumitomo 3M Co., Ltd.) was formulated between a negative electrode power feed part and a positive electrode power feed part of each pair of neighboring organic EL panels so as to connect them to each other.

Further, copper foil tapes with a soldered power feeding line (reverse-embossed copper foil tape No. 3245, Sumitomo 3M Co., Ltd.) were pasted on the power feed parts of the outer four organic EL panels that do not have an adjacent panel. A light emitting panel 1-1 was thus manufactured.

(2) Manufacture of Light Emitting Panel 1-2

A light emitting panel 1-2 was manufactured in the same manner as the light emitting panel 1-1 except that silicone adhesive (one-pack RTV rubber KE-347T, Shin-Etsu Chemical Co., Ltd.) was applied and cured in an L-shape on each transparent support substrate on the side opposite to the sealing member. The cured L-shape adhesives were used as guides to paste the organic EL panels to each other.

(3) Manufacture of Light Emitting Panel 1-3

A light emitting panel 1-3 was manufactured in the same manner as the light emitting panel 1-1 except that organic EL panels were manufactured using transparent support substrates that have a step on the face opposite the sealing member formed by etching, and the organic EL panels were pasted to each other on the basis of the steps.

(4) Manufacture of Light Emitting Panel 1-4

Example for Comparison

A light emitting panel 1-4 was manufactured by reference to Patent Document 2 (Japanese Patent Unexamined Publication No. 2009-139463).

Organic EL panels similar to those of the light emitting Panel 1-1 were used.

Figure 22:
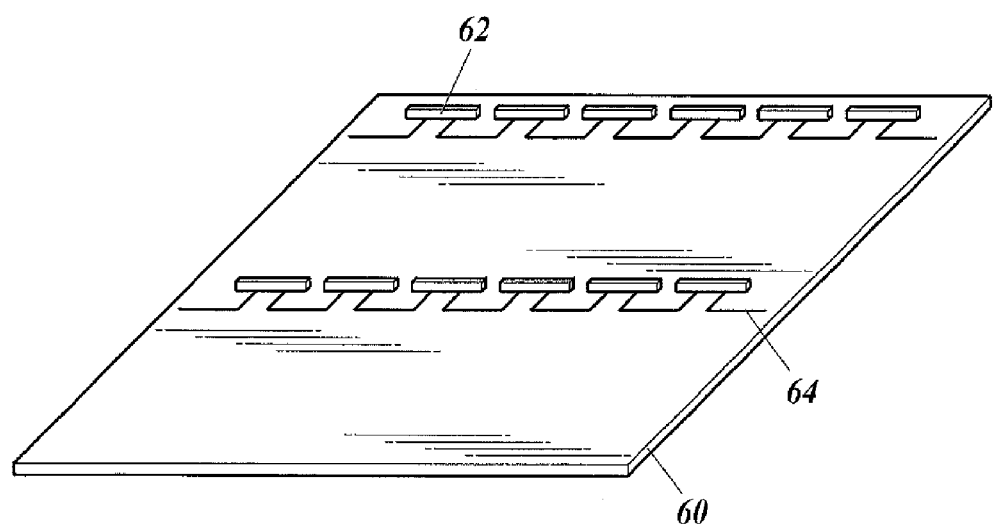
FIG. 22 is a perspective view illustrating the schematic configuration of a holder plate of Sample 1-4 in accordance with one or more embodiments of the invention.

A commercially available glass epoxy substrate 60 (1.6 mm thick) was patterned, and 12 FPC connectors (FH12A-10S-0.5SH, Hirose Electric Co., Ltd.) were mounted thereon as connectors 62. The connectors 62 were electrically connected to each other by wiring 64 (see FIG. 22).

Figure 23:
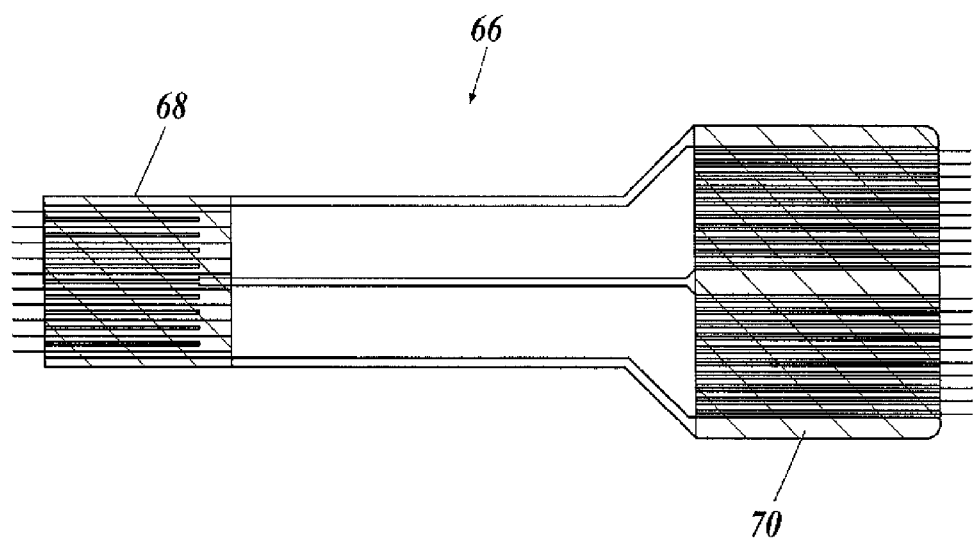
FIG. 23 is a schematic diagram illustrating the schematic configuration of an FPC of Sample 1-4 in accordance with one or more embodiments of the invention.

Next, a base member, which is composed of a base polyimide (12.5 μm) and a rolled copper foil (18 μm) pasted thereon by thermosetting resin, was patterned, and a polyimide film (18 μm) was pasted thereon by thermosetting resin as a cover lay member. The metal part was plated with Ni—Au by electronic plating. Connector joints 68 were formed in a shape corresponding to F12A-10S-SH (Hirose Electric Co., Ltd.). A polyimide film was pasted on the back side so that the total thickness of the base member and the reinforcing member became 300 μm. The FPC 66 was thus manufactured (see FIG. 23).

Figure 24:
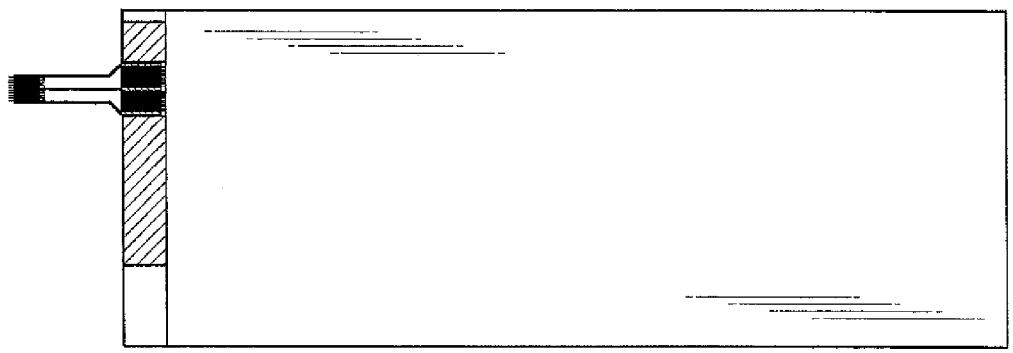
FIG. 24 is a plan view illustrating the method for connecting an organic EL panel of Sample 1-4 in accordance with one or more embodiments of the invention.

Next, a bonding portion 70 of the prepared FPC 66 was bonded to the power feed parts of the negative electrode and the auxiliary electrode of each organic El panel (see FIG. 24). An ACF (CP5720GT, Sony Chemical & Information Device Co., Ltd.) was used for the bonding. Subsequently, by using a commercial compression bonding apparatus, tentative compression bonding was carried out in the conditions of 80° C., 1 MPa and 2 seconds, and then main compression bonding was carried out in the conditions of 180° C., 3 MPa and 8 seconds.

Figure 25A:
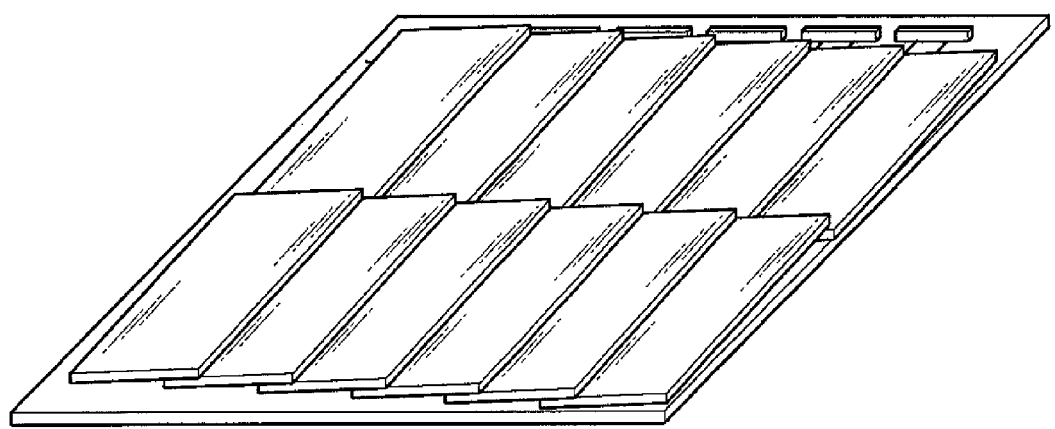
FIG. 25A is a perspective view illustrating the schematic configuration of a light emitting panel of Sample 1-4 in accordance with one or more embodiments of the invention.

Next, the organic EL panels on which the FPCs 66 were attached were connected to the connectors of the holder plate. The light emitting panel 1-2 was thus manufactured (see FIG. 25A).

The light emitting panels 1-1 to 1-3 were approximately 7 mm thick. They did not have any problem when they were placed in a vertical position or a horizontal position or were attached on a ceiling.

Figure 25B:
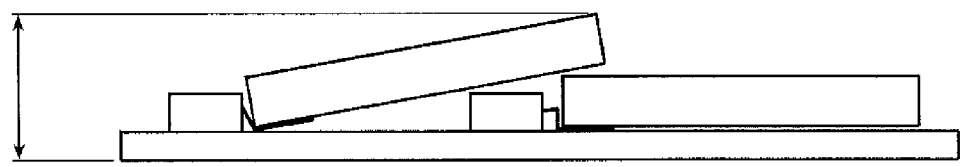
FIG. 25B is a side view illustrating the schematic configuration of the light emitting panel of Sample 1-4 in accordance with one or more embodiments of the invention.

In contrast, the light emitting panel 1-4 was approximately 10 mm thick. While it did not have any specific problem when it was placed in a horizontal position, such as on a table, it was unusable as a sheet illumination when it was placed in a vertical position or attached on a ceiling because the panels came off from the holder plate (see FIG. 25B).

As can be seen from the above, the light emitting panels 1-1 to 1-3 are thin and usable in any positions.

Example 2

(1) Manufacture of Light Emitting Panel 2-1

Figure 26:
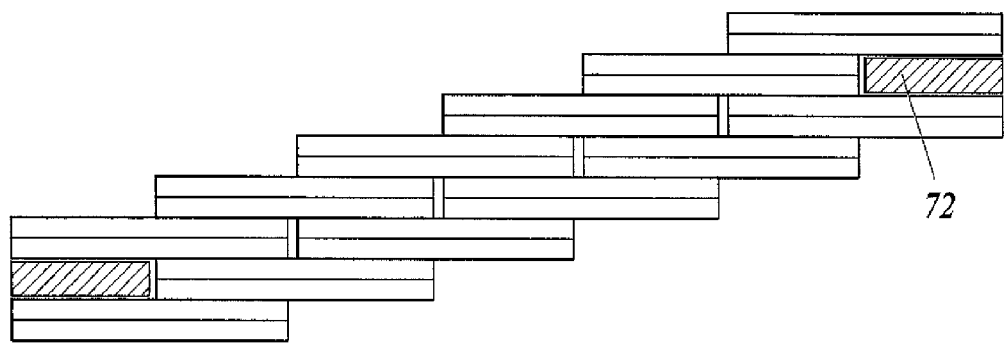
FIG. 26 is a side view illustrating the schematic configuration of a light emitting panel of Sample 2-1 in accordance with one or more embodiments of the invention.

As illustrated in FIG. 26, a light emitting panel 2-1 was manufactured in the same manner as the light emitting panel 1-1 except that double-layered 0.7 mm thick alkali free glass plates 72 were inserted and bonded in the spaces 4 and 4 as spacers.

(2) Manufacture of Light Emitting Panel 2-2

A light emitting panel 2-2 was manufactured in the same manner as the light emitting panel 2-1 except that the sealing members (method) and the spacers were changed as follows.

As each of the sealing members, a 0.7 mm thick alkali free glass (EAGLE XG, Corning Inc.) was cut into 66×167 mm, and was subjected to ultrasonic cleaning in isopropyl alcohol. Thereafter, the glass was dried in dry nitrogen gas, and was further subjected to UV ozone cleaning for 5 minutes.

Then, thermoset adhesive (sealer) was evenly applied on one face of the cleaned sealing member by using a dispenser. The sealing members were thus manufactured. For the thermoset adhesive, bisphenol A diglycidyl ether (DGEBA), dicyandiamide (DICY) and an epoxy adduct accelerating agent (epoxy adhesive) were used, and the thickness of the thermoset adhesive was 20 μm.

Next, the negative electrode and the sealing member were assembled together, and were placed in a commercially available vacuum laminating apparatus. Vacuum compression bonding was carried out for 5 minutes while heating at 90° C.

in the vacuum laminating apparatus. The pressure difference in this process was set to approximately 1 MPa. After the compression bonding, the panel was heated for 30 minutes on a hot plate at 110° C. to cure the resin. The organic EL panels were thus manufactured.

As spacers, 1.1 mm thick alkali free glass substrates were inserted.

The steps 42 of the jig were 1.4 mm high, and the steps 44 of the jig were 2.8 mm high.

(3) Manufacture of Light Emitting Panel 2-3

A light emitting panel 2-3 was manufacture in the same manner as the light emitting panel 2-2 except that the sealing members (method) were changed as follows.

As each of the sealing members, a 0.7 mm thick alkali free glass (EAGLE XG, Corning Inc.) was cut into 66×167 mm, and was subjected to ultrasonic cleaning in isopropyl alcohol. Thereafter, the glass was dried under dry nitrogen gas, and was further subjected to UV ozone cleaning for 5 minutes.

Then, glass frit was applied on the periphery of the glass substrate by using a screen printer, and was dried at 130° C. for 5 minutes. Further, it was baked at 430° C. for 10 minutes. The sealing member was thus manufactured.

Then, the negative electrode and the sealing member were assembled together, and were irradiated with a laser beam (semiconductor laser) having a wavelength of 940 nm and an output of 65 W from the side of the sealing member at a scanning rate of 10 mm/s to fuse and then to quench and solidify the adhesive (the baked glass frit), so that the substrate and the sealing member were sealed and bonded together. The organic EL panels were thus manufactured.

The light emitting panel 2-1 had improved bending resistance and the like compared to the light emitting panel 1-1, and the glasses on the edge were less likely to be broken. This structure is preferred in cases where a higher strength is required.

Further, the light emitting panel 2-2 exhibited more uniform light emission, and was reduced in thickness compared to the light emitting panel 2-1.

Further, the light emitting panel 2-3 was reduced in thickness compared to the light emitting panel 2-1.

Further, even after the light emitting panels 2-1 to 2-3 had kept in a thermostatic oven at 85° C. and 85% for 500 hours, a dark spot or a shrink was not caused and the conditions as light emitting elements remained at a good level.

Example 3

(1) Manufacture of Light Emitting Panel 3-1

A light emitting panel 3-1 was manufactured in the same manner as the light emitting panel 2-1 except that the support substrates, the sealing members (method) and the spacers were changed as follows.

As each of the transparent substrates, a transparent glass substrate (alkali free glass, Nippon Electric Glass Co., Ltd.) having a thickness of 0.2 mm and a size of 66×175 mm was used.

As each of the sealing members, a polyethylene naphthalate substrate (PEN substrate) (TEONEX Q83, Teijin DuPont Films Japan Ltd.) having a thickness of 125 μm and a size of 66×167 mm was prepared. On the PEN substrate, an inorganic gas barrier film of $SiO_x$ (500 nm thick) was formed by using an atmospheric-pressure plasma discharge processing apparatus that had a configuration as disclosed in Japanese Patent Unexamined Publication No. 2004-68143. In this way, a polyethylene naphthalate film having a gas barrier property of an oxygen permeability of 0.001 $cm^3/(m^2 \cdot 24\ h \cdot atm)$ or less and a water vapor permeability of 0.001 $g/(m^2 \cdot 24\ h)$ or less was manufactured.

Then, thermoset adhesive (sealer) was evenly applied on one face of the polyethylene naphthalate film by using a dispenser. The sealing members were thus manufactured. For the thermoset adhesive, bisphenol A diglycidyl ether (DGEBA), dicyandiamide (DICY) and an epoxy adduct accelerating agent (epoxy adhesive) were used. The thickness of the thermoset adhesive was 20 μm.

As the spacers, 0.2 mm thick alkali free glass substrates were inserted.

The steps 42 of the jig was approximately 0.3 mm high, and the steps 44 of the jig was 0.6 mm high.

(2) Manufacture of Light Emitting Panel 3-2

A light emitting panel 3-2 was manufactured in the same manner as the light emitting panel 3-1 except that the support substrates and the spacers were changed as follows.

As each of the support substrates, a polyethylene naphthalate substrate (PEN substrate) (TEONEX Q83, Teijin DuPont Films Japan Ltd.) having a thickness of 125 μm and a size of 66×175 mm was prepared.

On the PEN substrate, an inorganic gas barrier film of $SiO_x$ (500 nm thick) was formed by using an atmospheric-pressure plasma discharge processing apparatus that had a configuration as disclosed in Japanese Patent Unexamined Publication No. 2004-68143. In this way, a polyethylene naphthalate film having a gas barrier property of an oxygen permeability of 0.001 $cm^3/(m^2 \cdot 24\ h \cdot atm)$ or less and a water vapor permeability of 0.001 $g/(m^2 \cdot 24\ h)$ was prepared.

As the spacers, 125 μm PEN films (TEONEX Q83, Teijin DuPont Films Ltd.) were inserted.

The steps 42 of the jig were approximately 0.25 mm high, and the steps 44 of the jig were 0.5 mm high.

Comparing the light emitting panel 2-2, the light emitting panel 3-1 and the light emitting panel 3-2 with each other, the reduction in thickness and weight became greater in the order of the light emitting panels 2-2, 3-1 and 3-2.

Example 4

(1) Manufacture of Light Emitting Panel 4

A transparent acrylic resin member was pasted on the light emitting face of the light emitting panel 2-2 by using KE-1031-A/B (Shin-Etsu Silicone), and was cured at 80° C. for 2 hours.

Further, a light diffusion film (LIGHT-UP 100PBU, KIMOTO Co., Ltd) was pasted on the outer side of the transparent acrylic resin member.

An electric current of 2.5 $mA/cm^2$ was applied to each organic EL panel of the light emitting panel 2-2 and the light emitting panel 4, and the surface luminance was measured with a CA-2000 (Konica Minolta Sensing Co., Ltd.). The average brightness in the light emitting area excluding 1 cm periphery was defined as the measurement value.

Comparing the light emitting panel 2-2 with the light emitting panel 4, the light emitting panel 4 exhibited an approximately 1.4 times higher brightness, which showed that the acrylic plate and the light diffusion plate improved the brightness.

Example 5

(1) Manufacture of Light Emitting Panel 5-1

A light emitting panel 5-1 was manufactured in the same manner as the light emitting panel 2-2 except that the shapes of the positive electrodes (ITO) and the negative electrodes (aluminum) were changed as illustrated in FIG. 19A. A slit in the aluminum portion serves as an auxiliary electrode of each positive electrode. The aluminum portion was deposited to a film thickness of 300 nm.

(2) Manufacture of Light Emitting Panel 5-2

A light emitting panel 5-2 was manufactured in the same manner as the light emitting panel 2-2 except that the shapes of the positive electrodes (ITO) and the negative electrodes (aluminum) were changed as illustrated in FIG. 20A. The trapezoidal aluminum portion serves as an auxiliary electrode of each positive electrode. The aluminum portion was deposited to a film thickness of 300 nm.

(3) Manufacture of Light Emitting Panel 5-3

A light emitting panel 5-3 was manufactured in the same manner as the light emitting panel 1-1 except that the support substrates, the negative electrodes (aluminum), the shape of the sealing members and the number of the organic EL panels used were changed as follows.

As each of the support substrates, an alkali free glass (EAGLE XG, Corning Inc.) having a thickness of 0.7 mm and a size of 60×60 mm was used. The shape of the negative electrodes (aluminum) was changed as illustrated in FIG. 10A. The size of the light emitting parts was 40×40 mm. The rectangular aluminum part in the back part in the front-back direction B serves as an auxiliary electrode of each positive electrode.

As each of the sealing members, an alkali free glass (EAGLE XG, Corning Inc.) was cut into 0.7 mm thick and 60×57 mm.

Figure 27:
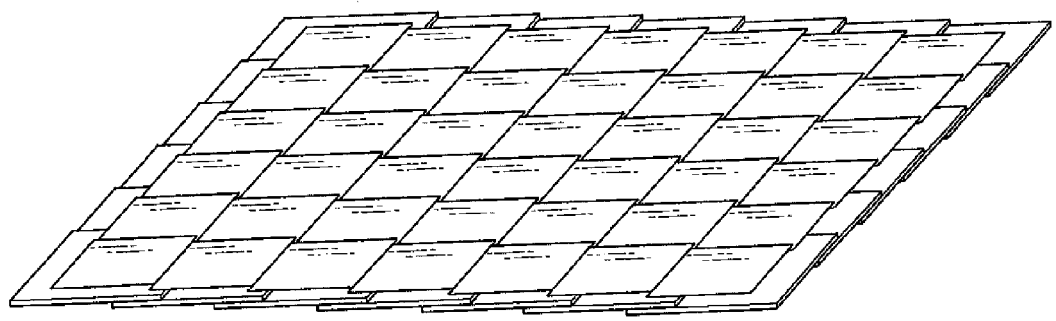
FIG. 27 is a perspective view illustrating the schematic configuration of a light emitting panel of Sample 5-3 in accordance with one or more embodiments of the invention.
Figure 28:
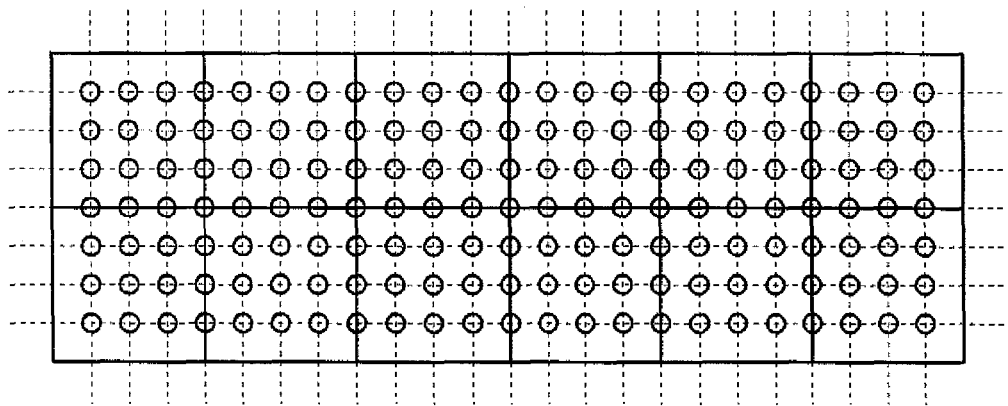
FIG. 28 is a schematic diagram illustrating a measuring method of brightness for samples of Example 5 in accordance with one or more embodiments of the invention.

Using 42 pieces (=6×7) of the prepared organic EL panels, the light emitting panel 5-3 was manufactured (see FIG. 27). The overlap widths W1 and W2 were 21 mm, and the overlap width W3 was 1 mm.

The steps 42 and 44 of the jig were fitted to the shape of the light emitting panel 5-3.

An electric current of 25 A/m² was applied to each panel of the light emitting, panel 2-2 and of the light emitting panels 5-1 to 5-3, and the surface luminance was measured with a CA-2000 (Konica Minolta Sensing Co., Ltd.).

As illustrated in FIG. 27, the brightness data was collected at 1 cm intervals, and the value of (minimum brightness/maximum brightness)×100 was defined as a brightness distribution value.

The results are shown in Table 1.

| Sample No. | Brightness Distribution (%) |
| --- | --- |
| 2-2 | 65 |
| 5-1 | 75 |
| 5-2 | 75 |
| 5-3 | 70 |

Comparing the light emitting panel 5-3 with the light emitting panel 2-2, it can be found that the light emitting panel 5-3 has reduced uneven brightness because aluminum, i.e. a low electrical resistance material, is used for the auxiliary electrodes of the positive electrodes.

Comparing the light emitting panels 5-1 and 5-2 with the light emitting panel 5-3, it can be found that the light emitting panels 5-1 and 5-2 have further reduced uneven brightness.

INDUSTRIAL APPLICABILITY

One or more embodiments of the invention are suitably applicable to, in particular, providing a large-area light emitting panel with high strength, high moisture resistance and high drip-proof performance.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 light emitting panel
2, 4 space
10 organic EL panel group
20 to 25 organic EL panel
30 support substrate
31 positive electrode
31a power feed part
32 organic compound layer
33 negative electrode
33a power feed part
34 sealing member
35 light emitting part
35a, 35b, 35c, 35d side
36 auxiliary electrode
36a power feed part
37 overlap portion
38 electrode
40 jig
42, 44 step
46 copper foil tape
47 adhesive
48 step
50, 52, 54 auxiliary electrode
52a power feed part
51 branch point
60 glass epoxy substrate
62 connector
64 wiring
66 FPC
68 connector joint
70 bonding portion
72 glass plate
A left-right direction
B front-back direction
W1, W2, W3 overlap width

The invention claimed is:
1. A light emitting panel, comprising:
a plurality of organic EL panels each of which comprises a laminate formed by laminating a positive electrode, an organic compound layer and a negative electrode on a transparent support substrate and a transparent sealing member to seal the laminate, in which the plurality of organic EL panels are laminated in a step-like shape in a front-back direction to form a plurality of organic EL panel groups, and the plurality of organic EL panel groups are further laminated in a step-like shape in a left-right direction, wherein each of the plurality of organic EL panels comprises a power feed part which is formed by exposing a part of the positive electrode and a part of the negative electrode of the laminate from the transparent sealing member at one side of the transparent support substrate in the left-right direction, and the power feed part of each of the plurality of organic EL panels is aligned with other power feed part in the front-back direction at one side of the left-right direction, and is disposed at a position that allows the power feed part to overlap with a laminate of an organic EL panel of an adjacent organic EL panel group, and an overlap width between the plurality of organic EL panels is at least seven times greater than the total thickness of the transparent support substrate and the transparent sealing member, and is equal to or narrower than half the width of the transparent support substrate.

2. The light emitting panel according to claim 1, wherein the sealing member is constituted by a flexible member.

3. The light emitting panel according to claim 2, the support substrate is constituted by a flexible member.

4. A method for manufacturing a light emitting panel in which a plurality of organic EL panels are laminated in a step-like shape in a front-back direction to form a plurality of organic EL panel groups, and the plurality of organic EL panel groups are further laminated in a steplike shape in a left-right direction, comprising:

manufacturing each of the plurality of organic EL panels by laminating a positive electrode, an organic compound layer and a negative electrode on a transparent support substrate to form a laminate, and sealing the laminate by a transparent sealing member such that a part of the positive electrode and a part of the negative electrode are exposed, and arranging the plurality of organic EL panels in a matrix of the front-back direction and the left-right direction such that a power feed part of each of the plurality of organic EL panels is aligned with other power feed part at one side of the left-right direction, the power feed part being the exposed part of the positive electrode and the exposed part of the negative electrode of each of the plurality of organic EL panels, wherein an overlap width between the plurality of organic EL panels is at least seven times greater than the total thickness of the transparent support substrate and the transparent sealing member, and is equal to or narrower than half the width of the transparent support substrate.

5. The method for manufacturing the light emitting panel according to claim 4, wherein the transparent sealing member is constituted by a flexible member.

6. The method for manufacturing the light emitting panel according to claim 5, wherein the transparent support substrate is constituted by a flexible member.

7. The method for manufacturing the light emitting panel according to claim 4, wherein in the arranging of the plurality of organic EL panels in the matrix, the plurality of organic EL panels are mounted on a jig.

8. The method for manufacturing the light emitting panel according to claim 5, wherein in the arranging of the plurality of organic EL panels in the matrix, the plurality of organic EL panels are mounted on a jig.

9. The method for manufacturing the light emitting panel according to claim 6, wherein in the arranging of the plurality of organic EL panels in the matrix, the plurality of organic EL panels are mounted on a jig.

\* \* \* \* \*